(12) United States Patent
Shur et al.

(10) Patent No.: US 10,790,410 B2
(45) Date of Patent: Sep. 29, 2020

(54) LIGHT EXTRACTION FROM OPTOELECTRONIC DEVICE

(71) Applicant: Sensor Electronic Technology, Inc., Columbia, SC (US)

(72) Inventors: Michael Shur, Latham, NY (US); Grigory Simin, Columbia, SC (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/331,895

(22) Filed: Oct. 23, 2016

(65) Prior Publication Data

US 2017/0117437 A1    Apr. 27, 2017

Related U.S. Application Data

(60) Provisional application No. 62/382,210, filed on Aug. 31, 2016, provisional application No. 62/245,518, (Continued)

(51) Int. Cl.
*H01L 33/06* (2010.01)
*H01L 33/32* (2010.01)
(Continued)

(52) U.S. Cl.
CPC ............. *H01L 33/06* (2013.01); *G06F 30/30* (2020.01); *H01L 31/02005* (2013.01);
(Continued)

(58) Field of Classification Search
CPC .............................. H01L 33/007; H01L 33/06
See application file for complete search history.

(56) References Cited

U.S. PATENT DOCUMENTS

| 7,407,872 B2 | 8/2008 | Han et al. |
| 9,020,005 B2 | 4/2015 | Wright et al. |

(Continued)

OTHER PUBLICATIONS

Sarwar, A., et al., "Tunnel Junction Enhanced Nanowire Ultraviolet Light Emitting Diodes," Department of Electrical and Computer Engineering, The Ohio State University, 17 pages.
(Continued)

*Primary Examiner* — Thao X Le
*Assistant Examiner* — Xia L Cross
(74) *Attorney, Agent, or Firm* — LaBatt, LLC

(57) ABSTRACT

An optoelectronic device configured for improved light extraction through a region of the device other than the substrate is described. A group III nitride semiconductor layer of a first polarity is located on the substrate and an active region can be located on the group III nitride semiconductor layer. A group III nitride semiconductor layer of a second polarity, different from the first polarity, can located adjacent to the active region. A first contact can directly contact the group III nitride semiconductor layer of the first polarity and a second contact can directly contact the group III nitride semiconductor layer of the second polarity. Each of the first and second contacts can include a plurality of openings extending entirely there through and the first and second contacts can form a photonic crystal structure. Some or all of the group III nitride semiconductor layers can be located in nanostructures.

12 Claims, 15 Drawing Sheets

Related U.S. Application Data filed on Oct. 23, 2015, provisional application No. 62/245,520, filed on Oct. 23, 2015.

(51) Int. Cl.

| | |
|---|---|
| *H01L 33/40* | (2010.01) |
| *H01L 33/64* | (2010.01) |
| *G06F 30/30* | (2020.01) |
| *H01L 31/02* | (2006.01) |
| *H01L 31/0224* | (2006.01) |
| *H01L 31/0232* | (2014.01) |
| *H01L 31/0304* | (2006.01) |
| *H01L 31/0352* | (2006.01) |
| *H01L 31/0392* | (2006.01) |
| *H01L 31/18* | (2006.01) |
| *H01L 33/00* | (2010.01) |
| *H01L 33/08* | (2010.01) |
| *H01L 33/12* | (2010.01) |
| *H01L 33/30* | (2010.01) |
| *H01L 33/42* | (2010.01) |
| *H01L 33/46* | (2010.01) |
| *H01L 33/38* | (2010.01) |
| *H01S 5/30* | (2006.01) |
| *H01S 5/343* | (2006.01) |

(52) U.S. Cl.
CPC .......... *H01L 31/02327* (2013.01); *H01L 31/022466* (2013.01); *H01L 31/03048* (2013.01); *H01L 31/0392* (2013.01); *H01L 31/035227* (2013.01); *H01L 31/035236* (2013.01); *H01L 31/1848* (2013.01); *H01L 31/1852* (2013.01); *H01L 33/007* (2013.01); *H01L 33/08* (2013.01); *H01L 33/12* (2013.01); *H01L 33/30* (2013.01); *H01L 33/32* (2013.01); *H01L 33/405* (2013.01); *H01L 33/42* (2013.01); *H01L 33/46* (2013.01); *H01L 33/642* (2013.01); *H01L 33/382* (2013.01); *H01L 2933/0091* (2013.01); *H01S 5/3054* (2013.01); *H01S 5/3086* (2013.01); *H01S 5/34333* (2013.01)

(56) References Cited

U.S. PATENT DOCUMENTS

| | | |
|---|---|---|
| 9,331,244 B2 | 5/2016 | Shatalov et al. |
| 9,425,353 B2 | 8/2016 | Shur et al. |
| 2007/0246700 A1 | 10/2007 | Park |
| 2011/0299074 A1* | 12/2011 | Kim .............. B82Y 10/00 356/326 |
| 2012/0164767 A1 | 6/2012 | Gasse et al. |
| 2012/0164796 A1* | 6/2012 | Lowenthal ............ H01L 25/048 438/127 |
| 2012/0205614 A1 | 8/2012 | Templier et al. |
| 2012/0241718 A1* | 9/2012 | Chen .............. H01L 33/38 257/13 |
| 2013/0112945 A1* | 5/2013 | Gilet .............. H01L 33/06 257/13 |
| 2014/0339587 A1 | 11/2014 | Kawaguchi et al. |
| 2014/0363912 A1 | 12/2014 | Ohlsson et al. |
| 2015/0108428 A1 | 4/2015 | Shatalov et al. |
| 2016/0111595 A1 | 4/2016 | Lee et al. |
| 2017/0104135 A1 | 4/2017 | Shur et al. |
| 2017/0117438 A1 | 4/2017 | Shur et al. |

OTHER PUBLICATIONS

Su, J., et al., "MOCVD Growth of AlGaN/GaN Heterostructures on 150 mm Silicon," CS MANTECH Conference, 2013, 4 pages.

Zhoo, S., "Aluminum nitride nanowire light emitting diodes: Breaking the fundamental bottleneck of deep ultraviolet light sources," Scientific Reports, Feb. 16, 2015, 5 pages.

Cross, X., U.S. Appl. No. 15/331,896, Office Action1, dated Jan. 26, 2018, 21 pages.

Joannopoulos, J., et al., "Photonic Crystals: Molding the Flow of Light," Princeton University Press, Copyright 2008, 286 pages (downloaded from http://ab-initio.mit.edu/book/ on Nov. 26, 2018).

Cross, X., U.S. Appl. No. 15/331,896, Final Office Action, dated Aug. 31, 2018, 13 pages.

Cross, X., U.S. Appl. No. 15/331,896, Office Action2, dated Feb. 8, 2019, 13 pages.

Cross, X., U.S. Appl. No. 15/331,896, Final Office Action 2, dated Aug. 21, 2019, 17 pages.

Cross, X., U.S. Appl. No. 15/331,891, Notice of Allowance, dated Feb. 13, 2020, 10 pages.

* cited by examiner

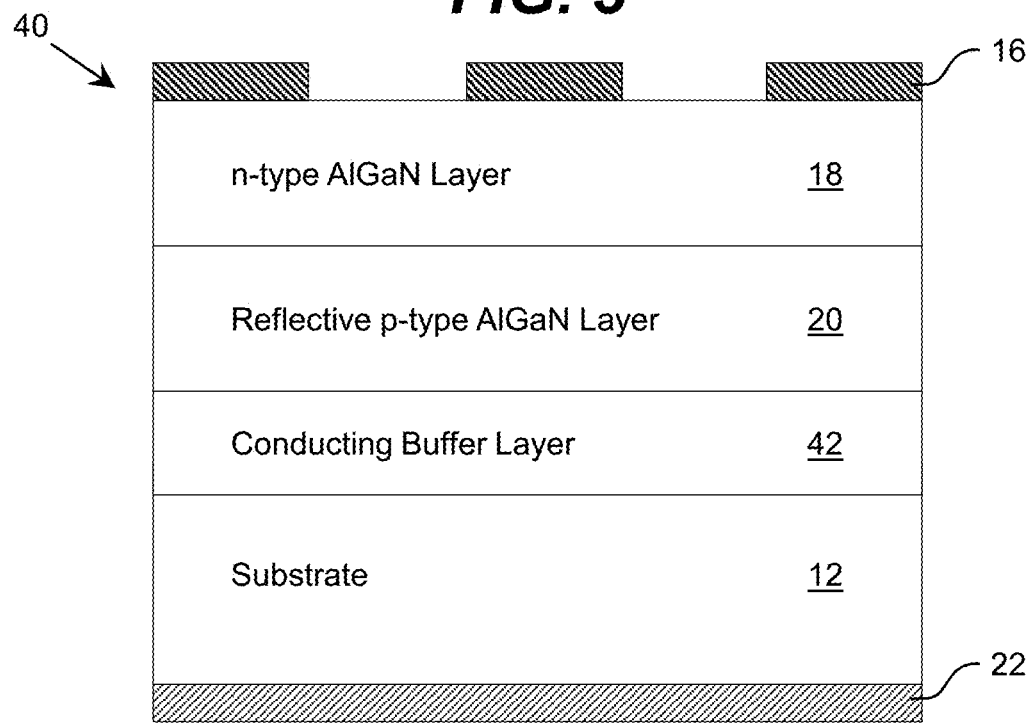
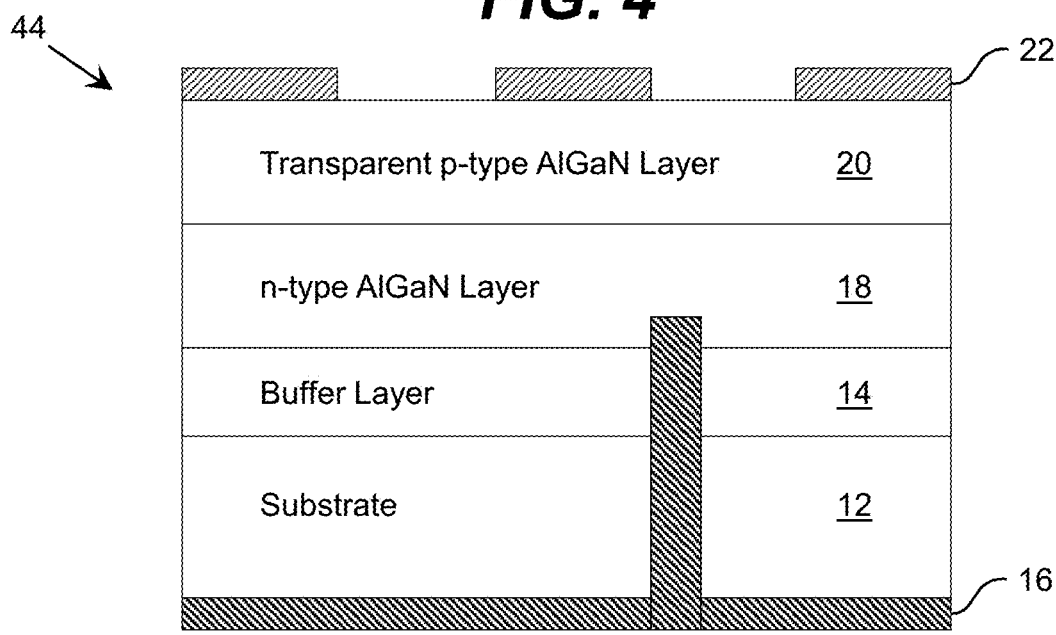

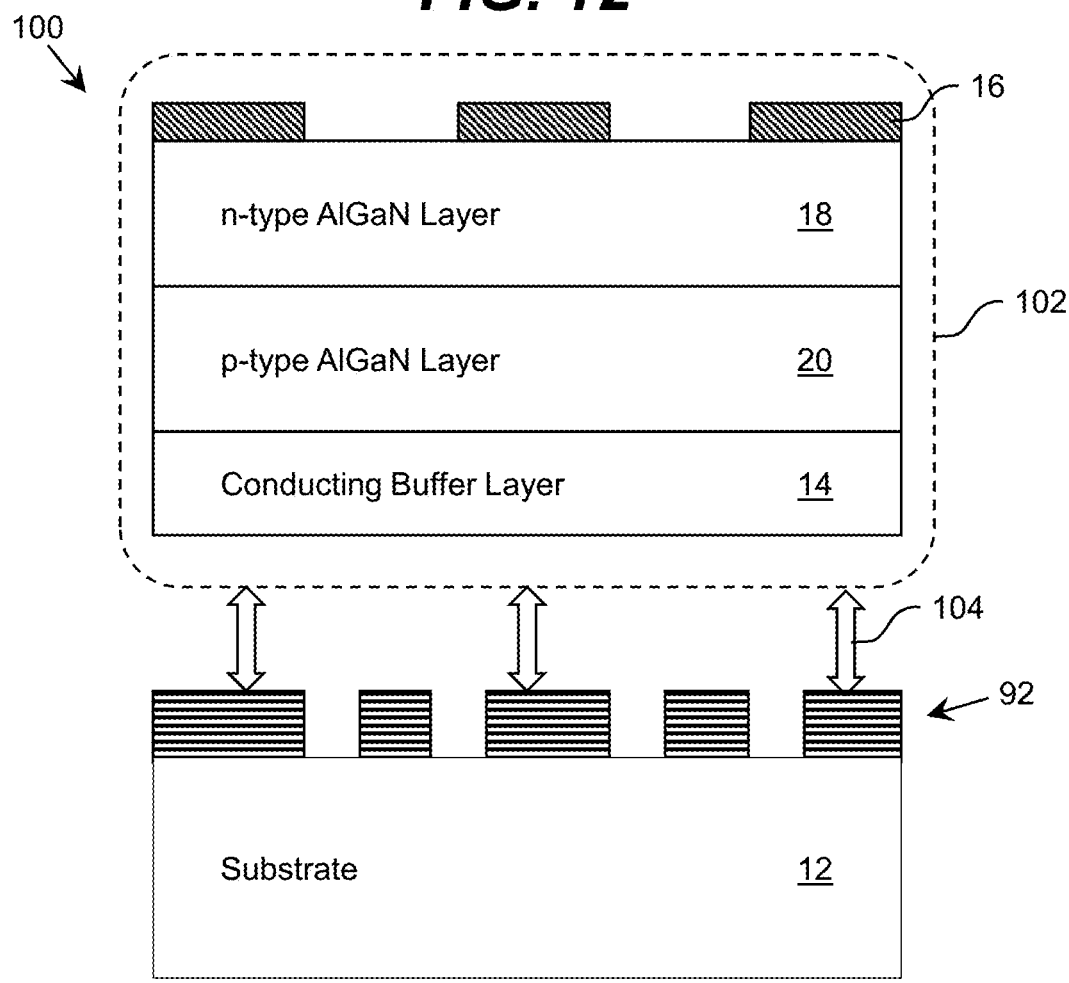

*FIG. 13A*
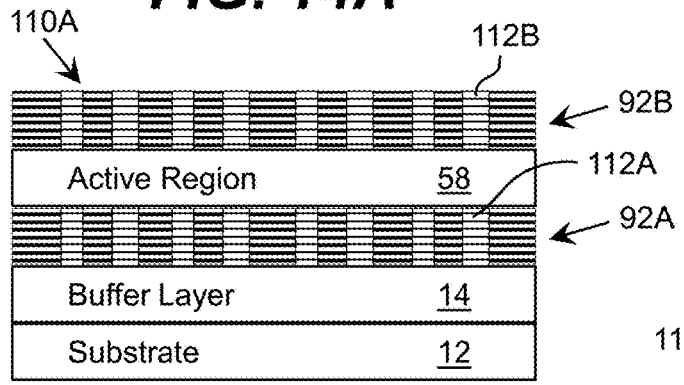
*FIG. 13B*
*FIG. 14A*
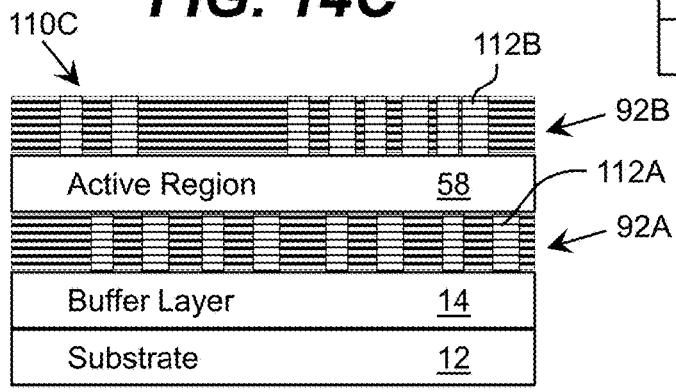
*FIG. 14B*
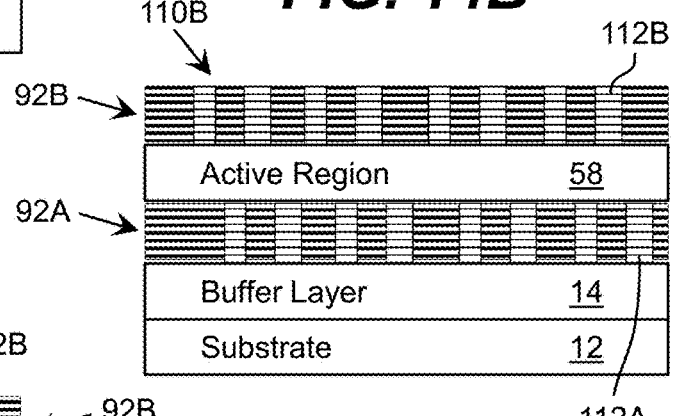
*FIG. 14C*

LIGHT EXTRACTION FROM OPTOELECTRONIC DEVICE

REFERENCE TO RELATED APPLICATIONS

The current application claims the benefit of U.S. Provisional Application No. 62/245,518, filed on 23 Oct. 2015, U.S. Provisional Application No. 62/245,520, which was filed on 23 Oct. 2015, and U.S. Provisional Application No. 62/382,210, filed on 31 Aug. 2016, each of which is hereby incorporated by reference. Aspects of the invention are related to U.S. patent application Ser. No. 15/331,896, filed on 23 Oct. 2016, which is also hereby incorporated by reference.

TECHNICAL FIELD

The disclosure relates generally to optoelectronic devices, and more particularly, to utilization of a light absorbing substrate in the fabrication of optoelectronic devices.

BACKGROUND ART

A great deal of interest has been focused on light emitting diodes and lasers, in particular those that emit light in the blue and deep ultraviolet (UV) wavelengths. These devices may be capable of being incorporated into various applications, including solid-state lighting, biochemical detection, high-density data storage, and the like.

Optoelectronic devices fabricated on a light absorbing substrate have been investigated. For example, semiconductor structures have been grown over silicon carbide (SiC). Unfortunately, SiC substrate wafers are expensive compared to sapphire and silicon wafers. Moreover, due to the low cost and availability of silicon substrates with larger diameters (>150 mm) compared with sapphire and SiC substrates, AlGaN/GaN based LEDs as well as High Electron Mobility Transistors (HEMTs) fabricated on silicon substrates have emerged as a promising candidate for optoelectronic and electronic applications.

With a large mismatch of the lattice constants and thermal expansion coefficients between silicon and GaN or AlN, epitaxy on silicon leads to problems such as cracks and high density misfit and threading dislocations. Many techniques have been utilized to relieve the stress and create crack-free GaN on silicon. For example, these techniques include inclusion of a low-temperature AlN layer, a graded AlGaN buffer layer, an AlN/GaN superlattice, a SiC intermediate layer, and a SiN interlayer. In addition, large wafer bowing caused by the compressive stress from AlGaN during growth hinders uniform temperature control across the wafer, which results in a non-uniform composition/thickness, layer stress, and lower device performance. With the growth challenges of hetero-epitaxy of AlGaN on silicon, device quality AlGaN and manufacturability have to be demonstrated for the potential mass production and broad applications of AlGaN LEDs fabricated on silicon.

Other approaches have investigated the epitaxial growth conditions and structure of contacts fabricated on light absorbing substrates.

SUMMARY OF THE INVENTION

Aspects of the invention provide an optoelectronic device configured for improved light extraction through a region of the device other than the substrate. A group III nitride semiconductor layer of a first polarity is located on the substrate and an active region can be located on the group III nitride semiconductor layer. A group III nitride semiconductor layer of a second polarity, different from the first polarity, can located adjacent to the active region. A first contact can directly contact the group III nitride semiconductor layer of the first polarity and a second contact can directly contact the group III nitride semiconductor layer of the second polarity. Each of the first and second contacts can include a plurality of openings extending entirely there through and the first and second contacts can form a photonic crystal structure. Some or all of the group III nitride semiconductor layers can be located in nanostructures.

A first aspect of the invention provides an optoelectronic device comprising: a substrate; a group III nitride semiconductor layer of a first polarity located on the substrate; an active region located on the group III nitride semiconductor layer; a transparent group III nitride semiconductor layer of a second polarity, different from the first polarity, located adjacent to the active region; a first reflective contact directly contacting the group III nitride semiconductor layer of the first polarity; and a second reflective contact directly contacting the transparent group III nitride semiconductor layer of the second polarity, wherein each of the first and second reflective contacts includes a plurality of openings extending entirely there through and the first and second reflective contacts form a photonic crystal structure.

A second aspect of the invention provides an optoelectronic device comprising: a substrate formed of a light absorbing material; a first plurality of nanostructures formed on the substrate, wherein the first plurality of nanostructures include: a group III nitride semiconductor layer of a first polarity located on the substrate; and an active region located on the group III nitride semiconductor layer; a group III nitride semiconductor layer of a second polarity, different from the first polarity, located adjacent to the active region; a first contact directly contacting the group III nitride semiconductor layer of the first polarity; and a second contact directly contacting the group III nitride semiconductor layer of the second polarity.

A third aspect of the invention provides an optoelectronic device comprising: a substrate formed of a light absorbing material; a group III nitride semiconductor layer of a first polarity located on the substrate; an active region located on the group III nitride semiconductor layer; a group III nitride semiconductor layer of a second polarity, different from the first polarity, located adjacent to the active region; a first contact directly contacting the group III nitride semiconductor layer of the first polarity; a second contact directly contacting the group III nitride semiconductor layer of the second polarity, wherein each of the first and second contacts includes a plurality of openings extending entirely there through and the first and second contacts form a photonic crystal structure; a heat sink; and a first integrated heat sink physically connecting the substrate to the heat sink, wherein the first integrated heat sink extends through the substrate and directly contacts the group III nitride semiconductor layer of the first polarity.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3 shows an illustrative heterostructure according to another embodiment of the invention.

FIG. 4 shows an illustrative heterostructure according to still another embodiment of the invention.

FIG. 12 shows formation of an illustrative device heterostructure according to an embodiment.

FIGS. 13A and 13B show illustrative heterostructures with Bragg reflective layers according to embodiments.

FIGS. 14A-14C show illustrative heterostructures including multiple Bragg reflective layers according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
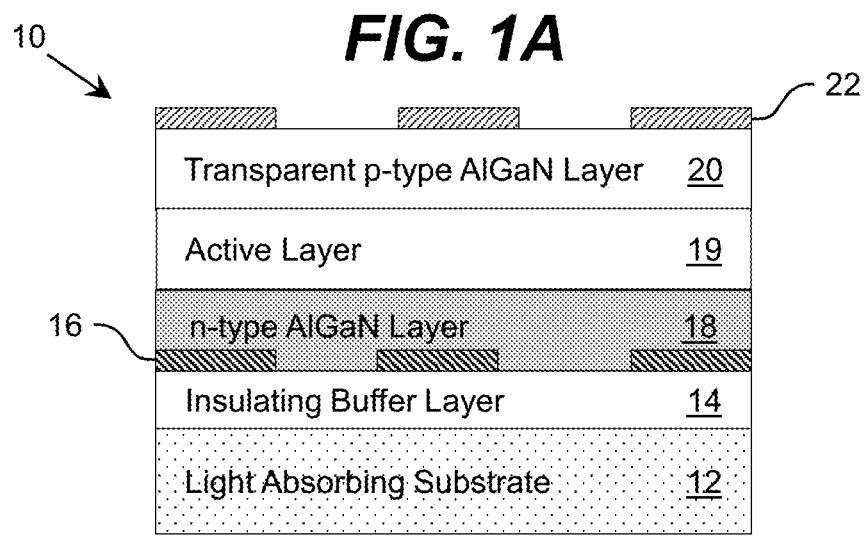
FIGS. 1A and 1B show schematic and exploded views, respectively, of an illustrative heterostructure according to an embodiment.

As indicated above, aspects of the invention provide an optoelectronic device configured for improved light extraction through a region of the device other than the substrate. A group III nitride semiconductor layer of a first polarity is located on the substrate and an active region can be located on the group III nitride semiconductor layer. A group III nitride semiconductor layer of a second polarity, different from the first polarity, can located adjacent to the active region. A first contact can directly contact the group III nitride semiconductor layer of the first polarity and a second contact can directly contact the group III nitride semiconductor layer of the second polarity. Each of the first and second contacts can include a plurality of openings extending entirely there through and the first and second contacts can form a photonic crystal structure. Some or all of the group III nitride semiconductor layers can be located in nanostructures.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/−ten percent of the stated value, while the term "substantially" is inclusive of values within +/−five percent of the stated value. Unless otherwise stated, two values are "similar" when the smaller value is within +/−twenty-five percent of the larger value. A value, y, is on the order of a stated value, x, when the value y satisfies the formula $0.1x \leq y \leq 10x$.

As also used herein, a layer is a transparent layer when the layer allows at least thirty percent of radiation having a target wavelength, which is radiated at a normal incidence to an interface of the layer, to pass there through. As used herein, a highly transparent layer allows at least fifty percent of such radiation to pass there through. Furthermore, as used herein, a layer is a reflective layer when the layer reflects at least thirty percent of radiation having a target wavelength, which is radiated at a normal incidence to an interface of the layer. As used herein, a highly reflective layer reflects at least fifty percent of such radiation. A layer is considered diffusively reflective when at least twenty percent of the reflected light is scattered in a direction that is at least ten degrees different from the specular direction of reflection. In an embodiment, the target wavelength of the radiation corresponds to a wavelength of radiation emitted or absorbed (e.g., peak wavelength +/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent).

In illustrative embodiments described herein, a light emitting diode (LED) is used to illustrate various aspects of the invention. As used herein, a LED means any type of semiconductor light emitting diode. Such a device can be flip-chip mounted. However, it is understood that a LED is only illustrative of various optoelectronic devices to which embodiments of the invention can be directed. Other illustrative optoelectronic devices include laser diodes. Furthermore, various illustrative devices described herein are fabricated from group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements. However, it is understood that embodiments can be directed to devices fabricated from other types of semiconductor materials, including other group III-V materials.

Figure 1B:
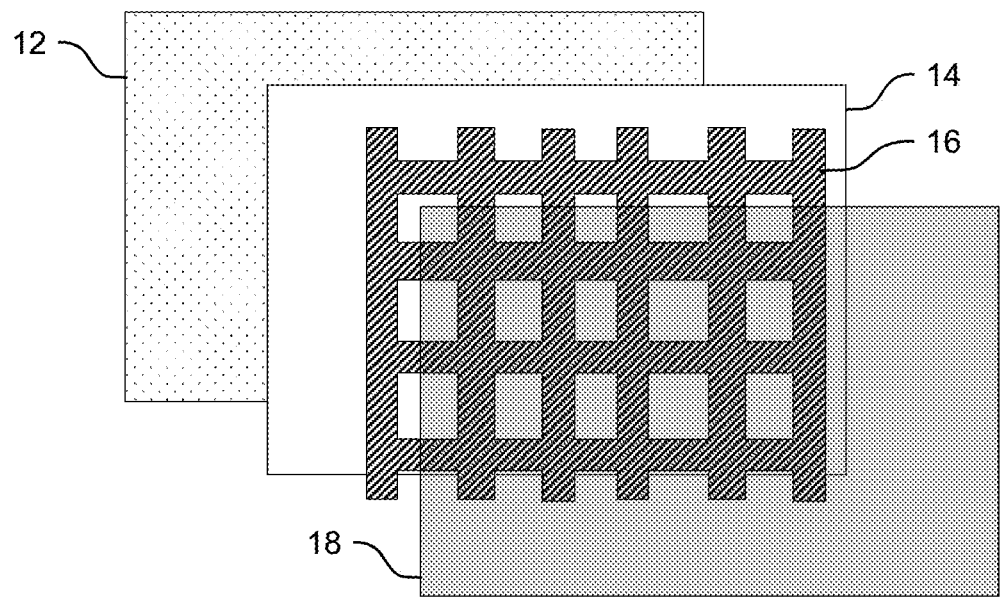

Turning to the drawings, FIGS. 1A and 1B show schematic and exploded views, respectively, of an illustrative heterostructure 10 according to an embodiment. The heterostructure 10 includes a light absorbing substrate 12, such as silicon carbide, silicon, and/or the like. In another embodiment, the substrate 12 can be an electrical conductive substrate having a p-type conductivity, such as p-type silicon carbide, p-type diamond, p-type silicon, and/or the like. Other illustrative materials for the substrate 12 include sapphire, aluminum nitride, gallium nitride, zinc oxide, lithium gallate, lithium niobate, diamond, silicon on insulator, silicon on sapphire, and/or the like. In an embodiment, the substrate is a temperature conducting material, which has a thermal conductivity exceeding 100 watts per meter kelvin (W/(m·K)).

An insulating buffer layer 14 is located on the substrate 12. The insulating buffer layer 14 can comprise, for example, aluminum nitride. While described as an insulating buffer layer 14 in this embodiment, it is understood that embodiments of the buffer layer can be conducting. In an embodiment, the buffer layer 14 can comprise multiple semiconductor sub-layers, with at least some sub-layers comprising n-type doped $Al_xGa_{1-x}N$ semiconductor sub-layers with $0 \le x \le 1$. The doping level can be selected to result in a desired level of conductivity of the n-type doped sub-layers. In yet another embodiment, the buffer layer 14 can comprise a p-type GaN layer epitaxially grown over the substrate 12. For such an embodiment, the substrate 12 can comprise a light absorbing substrate, such as Si or SiC.

As is known, using appropriate growth conditions, the epitaxially grown semiconductor layers of the heterostructure 10 can be formed without cracks, and can contain an acceptable number of dislocations for acceptable internal quantum efficiency of an epitaxially grown active layer. Aspects of the heterostructure 10 described herein provide possible design configurations allowing for improved light emission of optoelectronic devices fabricated from the heterostructure 10.

A layer of a first polarity, such as a n-type contact layer 16, can be located on the buffer layer 14. The n-type contact layer 16 can comprise, for example, a highly doped semiconductor layer. In an embodiment, the n-type contact layer 16 is located over only a portion of the insulating buffer layer 14. For example, a portion of the insulating buffer layer 14 can be covered by a n-type contact layer 16 formed of a highly doped $Al_xGa_{1-x}N$ semiconductor layer with an aluminum nitride molar fraction x<0.5, in a more specific embodiment x<0.1. The n-type contact layer 16 can comprise a n-type ohmic contact layer. Such a semiconductor layer can be highly n-type doped with Si, for example. In another embodiment, the n-type contact layer 16 can be formed of graphene.

The n-type contact layer 16 can comprise a patterned region. The patterned region can include a plurality of openings that extend entirely through the n-type contact layer 16, e.g., to a surface of the insulating buffer layer 18. For example, as shown in FIG. 1B, the n-type contact layer 16 can have a mesh pattern. In an embodiment, the openings can be rectangular openings having a length and width on the order of twice a thickness of the substrate 12. Regardless, the mesh parameters, such as the size of the openings and the width of the mesh elements, can be selected for optimal device performance. For instance, the mesh openings affect the epitaxial growth and can be selected to result in low stress, low dislocation density epitaxial layers grown over the mesh.

A n-type AlGaN layer 18 is located on the n-type contact layer 16. While illustrative aspects of the invention are described in conjunction with an AlGaN layer, it is understood that the layer 18 can be formed of other group III nitride materials, such as AlInN, AlInGaN, and/or the like. Regardless, as illustrated, the n-type AlGaN layer 18 penetrates openings in the n-type contact layer 16 and also contacts the insulating buffer layer 14. The n-type AlGaN layer 18 can have a higher aluminum content than the n-type contact layer 16. For example, the n-type AlGaN layer 18 can have an aluminum nitride molar fraction higher than 0.3, in a more specific embodiment higher than 0.4. In an embodiment, the n-type AlGaN layer 18 has an aluminum nitride molar fraction that is at least ten percent higher than the aluminum molar fraction of the n-type contact layer 16. The n-type AlGaN layer 18 can be doped with n-type dopants.

An active region 19 is located on the n-type AlGaN layer 18. The active region 19 can be configured to emit or sense radiation having any desired wavelength during operation of a corresponding device. In an embodiment, the active region 19 includes a plurality of quantum wells alternating with a plurality of barriers. In an embodiment, the active region 19 can comprise $Al_xGa_{1-x}N$ with $0 \le x \le 1$. In an alternative embodiment, the active region 19 can include group III nitride materials chosen from one or more group III elements (e.g., boron (B), aluminum (Al), gallium (Ga), and indium (In)) and nitrogen (N), such that $B_WAl_xGa_yIn_zN$, where $0 \le W, X, Y, Z \le 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements. It is understood that while the active region 19 is not shown in each embodiment described herein, each heterostructure described herein can include an active region 19 located between the two layers of opposite polarities (e.g., the n-type and p-type layers shown adjacent to each other in some embodiments).

The heterostructure 10 is further shown including a transparent p-type AlGaN layer 20 located on the n-type AlGaN layer 18. While illustrative aspects of the invention are described in conjunction with an AlGaN layer, it is understood that the layer 20 can be formed of other group III nitride materials, such as $B_WAl_xGa_yIn_zN$, where $0 \le W, X, Y, Z \le 1$, and $W+X+Y+Z=1$. The transparent p-type AlGaN layer 20 can be doped with p-type dopants. In an embodiment, the transparent p-type AlGaN layer 20 comprises a thin $Al_xGa_{1-x}N/Al_yGa_{1-y}N$ superlattice, where the molar fractions x and y are different. To this extent, each sub-layer of the superlattice can have a thickness that is less than the inverse of the absorption coefficient of radiation having a target wavelength in the corresponding material. In another embodiment, the transparent p-type AlGaN layer 20 comprises a superlattice having transparent and conductive regions as shown, for example, in U.S. patent application Ser. No. 14/189,012, which was filed on 25 Feb. 2014 and which is hereby incorporated by reference. In this case, the conductive regions can form a set of percolated domains, which can provide for efficient spread of electrical current through the transparent p-type AlGaN layer 20. Since the transparent p-type AlGaN layer 20 is p-type doped, it can have at least some sub-layers with high gallium nitride molar fraction. In an embodiment, the transparent p-type AlGaN layer 20 can comprise $Al_xGa_{1-x}N/Al_yGa_{1-y}N$ superlattice with $0 \le x \le 0.4$ and $0.4 \le y \le 1$. In an embodiment, the thickness of each sub-layer within a superlattice does not exceed 10 nm. FIG. 1A shows that the n-type layer 18 and the p-type layer 20 serve as a n-type and p-type contacts to the active layer 19 located between the layers 18 and 20.

A p-type contact layer 22 is shown located on the transparent p-type AlGaN layer 20. The p-type contact layer 22 also can be located over only a portion of the transparent p-type AlGaN layer 20 (e.g., include openings, have a mesh pattern, and/or the like). In an embodiment, the p-type contact layer 22 comprises a reflective p-type ohmic contact. For example, the p-type contact layer 22 can comprise metallic regions annealed to the p-type AlGaN layer 20. These regions can be transparent to or reflective of the target radiation (e.g., radiation generated by an active structure of a corresponding device).

In an embodiment, the p-type contact layer 22 comprises a metallic structure containing a first transparent ohmic layer adjacent to the surface of the transparent p-type AlGaN layer 20, a second protective metallic layer deposited over the first layer, and a third reflective metallic layer deposited over the second layer. The first ohmic layer can comprise nickel (Ni), the second layer can comprise palladium (Pd) and/or rhodium (Rh), and the third layer can comprise aluminum (Al). The metallic layers can further be protected from oxidation by depositing gold (Au). Similar to the mesh characteristics of the n-type contact layer 16, the p-type contact layer 22 can comprise a mesh structure, with the parameters of the mesh structure optimized for efficient light extraction, while providing the sufficient specific contact conductivity to the transparent p-type AlGaN layer 20.

As illustrated, both the n-type contact layer 16 and the p-type contact layer 22 can include openings. These openings can be patterned or irregularly spaced and/or sized. Furthermore, the openings in the p-type contact layer 22 can be laterally aligned with or laterally shifted with respect to the openings in the n-type contact layer 16. For example, the n-type contact layer 16 and the p-type contact layer 22 can be arranged with openings such that the n-type contact layer 16 and the p-type contact layer 22 form a photonic crystal structure.

The heterostructure 10 can be fabricated using any solution. For example, fabrication can included growth of the insulating buffer layer 14 on the substrate 12, followed by deposition of the n-type contact layer 16 on the buffer layer 14. Formation of the n-type contact layer 16 can use any solution in order to create openings in the n-type contact layer 16. For example, the openings can be created by physical vapor deposition of the n-type contact layer 16 followed by photolithography. Alternatively, a patterned mask, having openings, can be deposited over the buffer layer 14, followed by physical vapor deposition of the n-type contact layer 16 over the exposed openings within the mask. Subsequently the mask can be removed through etching. Regardless, the n-type AlGaN layer 18 can be overgrown on the n-type contact layer 16 and the buffer layer 14, the transparent p-type AlGaN layer 20 can be overgrown on the n-type AlGaN layer 18, and the p-type contact layer 22 can be deposited on the transparent p-type AlGaN layer 20.

However, it is understood that a semiconductor having a mesh pattern is only illustrative of various possible configurations for a n-type contact layer 16. For example, in another embodiment, the n-type contact layer 16 is in the form of islands. Such islands can have a periodic or aperiodic distribution. Additionally, the n-type contact layer 16 can comprise regions of a reflective metal, such as aluminum. To this extent, an embodiment of the n-type contact layer 16 can comprise islands of reflective aluminum. In another embodiment, the n-type contact layer 16 comprises titanium having a melting temperature larger than the temperature used to grow the semiconductor layers 18, 20, 22 thereon.

Fabrication of the heterostructure 10 can include placing metallic regions (e.g., aluminum or titanium) over the light absorbing substrate 12 and/or buffer layer 14 (e.g., for the purpose of providing light reflectance at the boundary between the layers 14, 18). Such placement can include deposition of the metal using sputtering, evaporation, and/or the like. Subsequently, these regions can be masked to avoid contamination during subsequent growth, followed by performing the epitaxial growth of a semiconductor portion of the n-type contact layer 16 and/or the n-type AlGaN layer 18, e.g., using MOCVD in a MOCVD chamber.

When titanium is utilized, to avoid chamber contamination with particles of titanium and to prevent significant alteration and annealing of a titanium layer, a low temperature epitaxial growth solution can be utilized. For example, the n-type AlGaN layer 18 can include a sub-layer immediately adjacent to the n-type contact layer 16, which is grown at a temperature in a range of 700° Celsius to 1100° C. The sub-layer can comprise, for example, an $Al_xGa_{1-x}N$ or $Al_xIn_yGa_{1-x-y}N$ sub-layer, with a low molar fraction of aluminum nitride, e.g., an aluminum molar fraction x<0.5. The sub-layer can comprise a thin semiconductor layer with a thickness in the range of 10-500 nm. Fabrication of the sub-layer can be followed by growth of a remainder of the n-type AlGaN layer 18 at a higher temperature and having a higher aluminum nitride composition.

It is understood that the n-type AlGaN layer 18 and/or the sub-layer of the n-type AlGaN layer 18 can have a graded composition from a low aluminum nitride molar fraction immediately adjacent to the n-type contact layer 16 to a high aluminum nitride molar fraction immediately adjacent to the transparent p-type AlGaN layer 20. For instance, the aluminum nitride molar fraction x can be between 0-0.1 in the sub-layer of the n-type AlGaN layer 18 and can be as high as 0.9 at the top of the n-type AlGaN layer 18. It is understood that sub-layer of the n-type AlGaN layer 18 can be gradually graded with x varying between values of 0-0.9. The Al molar fraction of the n-type AlGaN layer 18 in the region adjacent to active region (which can be at least 10 nm thick) is at most 20% different from the Al molar fraction of the first layer within the active region. For a heterostructure designed for optoelectronic devices operating in the UV range, the Al molar fraction in the region adjacent to active region is higher than 0.3. It is further understood that a growth temperature of the n-type AlGaN layer 18 can be varied from a low temperature used during growth at the beginning of the layer (e.g., growth of the sub-layer) to high temperatures used during growth of a top portion of the layer.

Access to the n-type contact layer 16 can be provided using any solution. For example, in an embodiment, the heterostructure 10 can be etched to expose a surface of the n-type contact layer 16. To this extent, the etching can include etching a portion of the substrate 12 and the insulating buffer layer 14. Alternatively, portions of the various layers 18, 20, 22 can be etched to expose a surface of the n-type contact layer 16. Still further, overgrowth of the layers 18, 20, 22 can use an approach, which prevents growth of the layers 18, 20, 22 on a portion of the n-type contact layer 16.

Figure 2A:
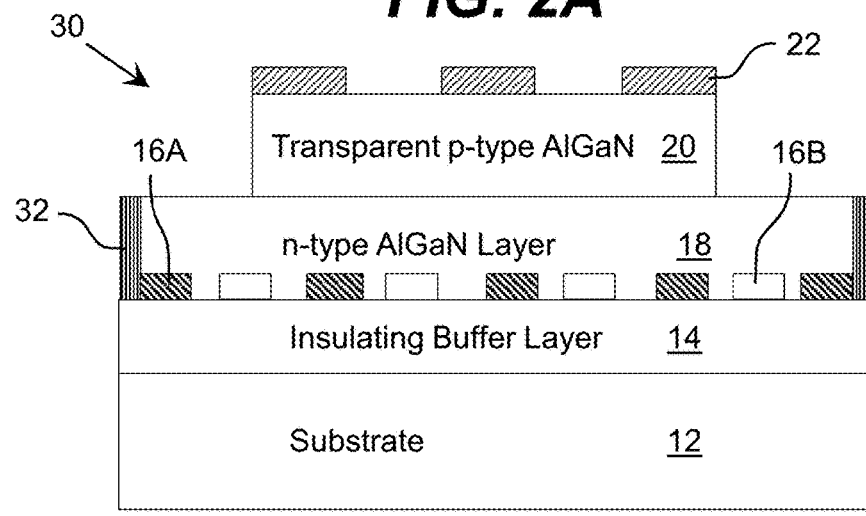
FIGS. 2A-2C show additional features of a heterostructure according to embodiments.
Figure 2B:
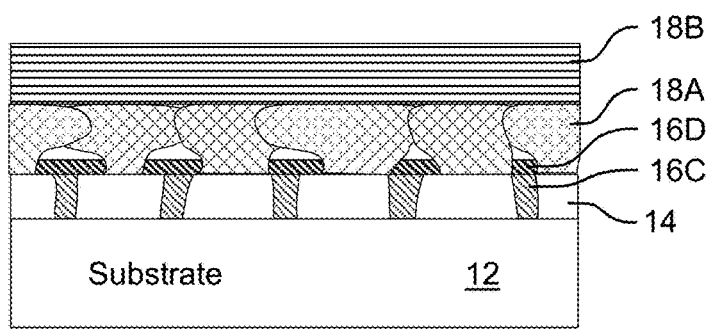
Figure 2C:
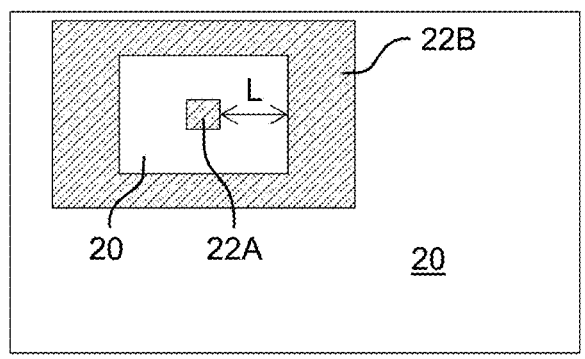

FIGS. 2A-2C show additional features of a heterostructure and/or device described herein according to embodiments. In FIG. 2A, a device 30 (e.g., an optoelectronic device) is shown including a n-type contact layer comprising a set of highly conductive regions 16A and a set of dielectric masking regions 16B. For example, the set of highly conductive regions 16A can comprise a material described in conjunction with the n-type contact layer 16 (FIGS. 1A and 1B), such as a highly doped $Al_xGa_{1-x}N$ semiconductor layer with an aluminum nitride molar fraction x<0.5, in a more specific embodiment x<0.1.

The dielectric masking regions 16B can comprise a dielectric containing reflective metallic regions. In particular, the dielectric masking regions 16B can comprise omni-directional mirrors. For instance, the dielectric masking regions 16B can have a first layer adjacent to the substrate being a reflective metallic aluminum layer, and a second layer deposited over the first layer being a transparent dielectric layer such as $SiO_2$, $Al_2O_3$, and/or the like. The layers can be deposited either through physical vapor deposition (PVD) or sputtering.

Furthermore, the device 30 is shown including a set of metallic contacts 32 located on one or more side surfaces of the n-type contact layer and the n-type AlGaN layer 18. In this configuration, at least some portion of a metallic contact 32 can directly contact one or more of the highly conductive regions 16A of the n-type contact layer. Each metallic contact 32 can be formed of any type of metal. For instance, the metal can comprise Al, Ag, Au, Ti, chrome, and/or the like.

FIG. 2B shows an alternative configuration of the insulating buffer layer 14, n-type contact layer, and n-type AlGaN layer according to an embodiment. In this case, the buffer layer 14 can comprise a porous or columnar structure, which includes one or more openings extending all the way through the buffer layer 14 to a surface of the substrate 12. The buffer layer 14 can be formed using any solution. For example, the buffer layer 14 can be formed using a three-dimensional growth solution as described in U.S. patent application Ser. No. 14/519,230, which was filed on 21 Oct. 2014, and which is hereby incorporated by reference. Alternatively, the buffer layer 14 can be formed by etching the buffer layer 14 to form micro- or nano-pillars as described in U.S. patent application Ser. No. 14/504,456, which was filed on 2 Oct. 2014, and which is hereby incorporated by reference.

Regardless, a metallic sub-layer 16C (e.g., aluminum, titanium, or the like) can be deposited into the openings of the buffer layer 14. Furthermore, a group III nitride semiconductor layer 16D having high doping regions can be located on the metallic sub-layer 16C and the buffer layer 14. The group III nitride semiconductor layer 16D can form discontinuous and/or connected regions of the highly conductive semiconductor material. The group III nitride semiconductor layer 16D can be formed using any solution, e.g., sputtering and subsequent partial etching.

Formation of the n-type AlGaN layer can include epitaxial overgrowth of a sub-layer 18A including various regions followed by growth of a continuous AlGaN sub-layer 18B. The sub-layer 18A can have a composition selected to promote epitaxial overgrowth. For example, the sub-layer 18A can comprise $Al_xGa_{1-x}N$ with a high molar fraction x>0.5 of gallium nitride. The sublayer 18B can comprise $Al_xGa_{1-x}N$ with a gallium nitride molar fraction at least 10% lower than the molar fraction of the sublayer 18A. It should be understood, that the above example is only illustrative, and other embodiments are possible. For example, the n-type AlGaN layer can comprise a graded composition without having a clear interface between sub-layers 18A and 18B. Furthermore, the sublayer 18B can be a semiconductor heterostructure with improved light reflective characteristics. For example, such a heterostructure can comprise a Bragg reflecting $Al_xGa_{1-x}N/AlGa_{1-y}N$ lattice structure.

As described herein, the p-type contact layer 22 can comprise a p-type contact layer located on a top surface of the device. In an embodiment, the p-type contact layer 22 is designed to allow for more efficient light extraction from the top surface of the device. For example, a total lateral area of the p-type contact layer 22, which may be light absorbing, can be only a fraction of a total lateral area of the device. The fraction can be selected to optimize the performance of the device, and can be within a range of 0.1-0.9, but in a more particular embodiment can be about 0.5. In an embodiment, the contact regions of the p-type contact layer 22 are separated by a distance comparable to (i.e., less than or equal to twice of) a current spreading length.

FIG. 2C shows a top view of an illustrative transparent p-type AlGaN layer 20 and corresponding second contact regions 22A, 22B according to an embodiment. As illustrated, the p-type contact layer includes a first region 22A, which is surrounded by a second region 22B. A separation, L, between the regions 22A, 22B is comparable to the current spreading length of the transparent p-type AlGaN layer 20. As also illustrated, a total lateral area occupied by the second contact regions 22A, 22B is approximately one quarter of a total lateral area of the transparent p-type AlGaN layer 20.

While embodiments include n-type layers adjacent to the substrate 12, it is understood that other embodiments of heterostructures and/or devices can include p-type layers adjacent to the substrate 12. For example, FIG. 3 shows an illustrative heterostructure 40 according to another embodiment of the invention. In this case, the heterostructure 40 includes a conducting buffer layer 42 located on the substrate 12, which can comprise silicon or silicon carbide. In an embodiment, the conducting buffer layer 42 comprises GaN or AlGaN. In a further embodiment, the substrate 12 can comprise a p-type conductor, such as p-type silicon, p-type GaN, and/or the like.

Additionally, the heterostructure 40 includes an embodiment of a p-type layer 20 comprising a semiconductor heterostructure with improved light reflective characteristics. For example, such heterostructure can comprise a Bragg reflecting p-type doped $Al_xGa_{1-x}N/Al_yGa_{1-y}N$ lattice structure. Alternatively, the p-type layer 20 can comprise a p-type AlGaN layer with reflective domains, where the reflective domains can comprise metallic domains or insulating domains. In an embodiment, a n-type cladding layer has a high aluminum nitride molar fraction x (x>0.4) to be transparent to the radiation for which the heterostructure is designed.

As illustrated in FIG. 3, the n-type contact layer 16 can comprise a plurality of metallic (e.g., aluminum, titanium, and/or the like) regions with reflective and/or transparent characteristics as described herein. Similar to the p-type contact shown and described in conjunction with FIG. 2C, the metallic regions of the n-type contact layer 16 can be separated by a distance, L, comparable to the corresponding current spreading length of the n-type AlGaN layer 18. Furthermore, the p-type contact layer 22 can be located on an opposing side of the substrate 12 as the conducting buffer layer 42. Such a placement for the p-type contact layer 22 is suitable when the p-type substrate 12 maintains sufficient p-type conductivity.

However, it is understood that the heterostructure 40 is only illustrative and various solutions can be utilized for placing and accessing the p-type contact layer 22. For example, embodiments comprise heterostructures similar to those shown in FIGS. 1A-2C, but with the location of the n-type and p-type layers and contacts reversed. To this extent, the discussion of embodiments of the n-type layers and contacts shown herein apply equally to embodiments in which the polarity of the n-type layers and contacts and p-type layers and contacts are reversed.

Embodiments of p-type contact layers located within the heterostructure as shown and described in conjunction with the n-type contact layers in FIGS. 1A-2B, can contain one or more layers of nickel, rhodium, and/or the like. Furthermore, similar to the previous discussion of n-type layers and FIG. 2B, an embodiment of a heterostructure can include a AlN buffer layer grown on the substrate 12, followed by placement of p-type contact layers, overgrowth of the p-type contact layers with a p-type semiconductor layer (e.g., a thin layer of 10-500 nm thick) using low temperature epitaxial growth, and subsequent growth of a GaN layer and/or a graded layer, an active layer, and a transparent n-type semiconductor layer 18. Electrodes can be attached to p-type contact layers located within the heterostructure using any solution, such as via the side walls of the device (e.g., as shown in FIG. 2A), etching the substrate 12 and/or conducting buffer layer 42, and/or the like.

As shown in FIG. 4, an embodiment of a heterostructure 44 can include an n-type contact layer 16 located on an opposing side of the substrate 12 as a conducting buffer layer 14. Such a configuration can be utilized when the substrate 12 is sufficiently conducting. In an embodiment, the n-type contact layer 16 can penetrate the insulating substrate 12 and the buffer layer 14 to reach the n-type semiconductor contact layer 18. In an alternative embodiment, the substrate 12 can be lifted off and the n-type contact layer 16 can be deposited over the buffer layer 14. For such cases, the buffer layer 14 can comprise a conductive n-type $Al_xGa_{1-x}N$ layer. In an embodiment, the n-type contact layer 16 can penetrate the buffer layer 14 in order to reach the n-type semiconductor contact layer 18. In such cases, the buffer layer 14 can be etched to allow penetration of the n-type contact layer 16. In an embodiment, both the substrate 12 and the buffer layer 14 can have sufficient conductivity. For example, the buffer layer 14 can comprise a n-type doped $Al_xGa_{1-x}N$ layer and the substrate can comprise an n-type doped Si or SiC layer.

Figure 5A:
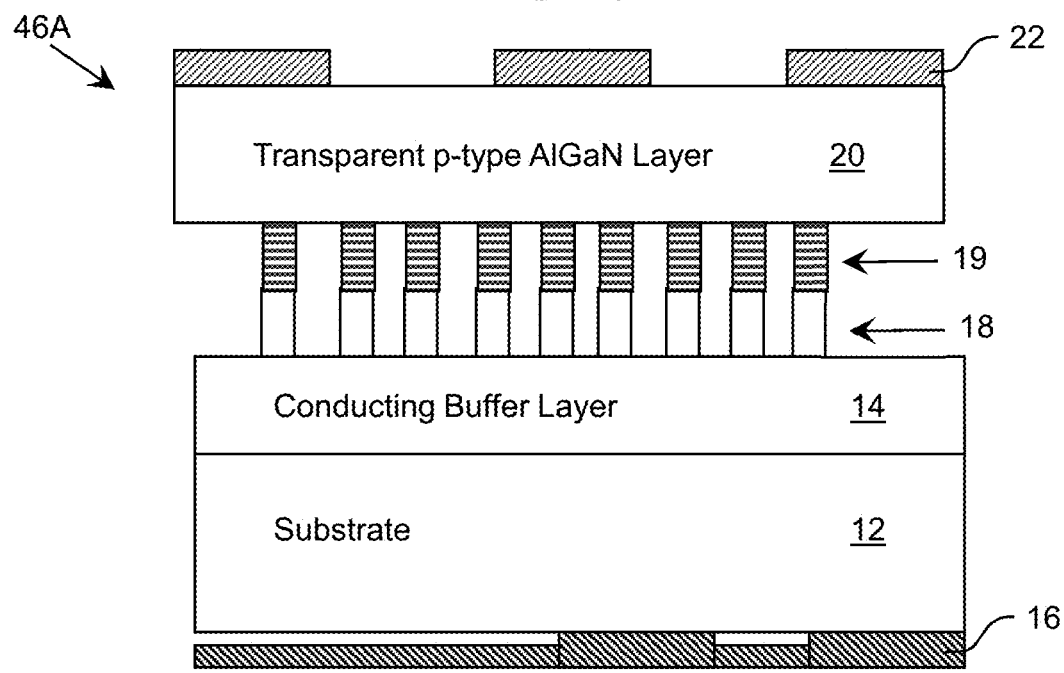
FIGS. 5A and 5B show illustrative heterostructures including a semiconductor layer formed using nanostructures according to embodiments.
Figure 5B:
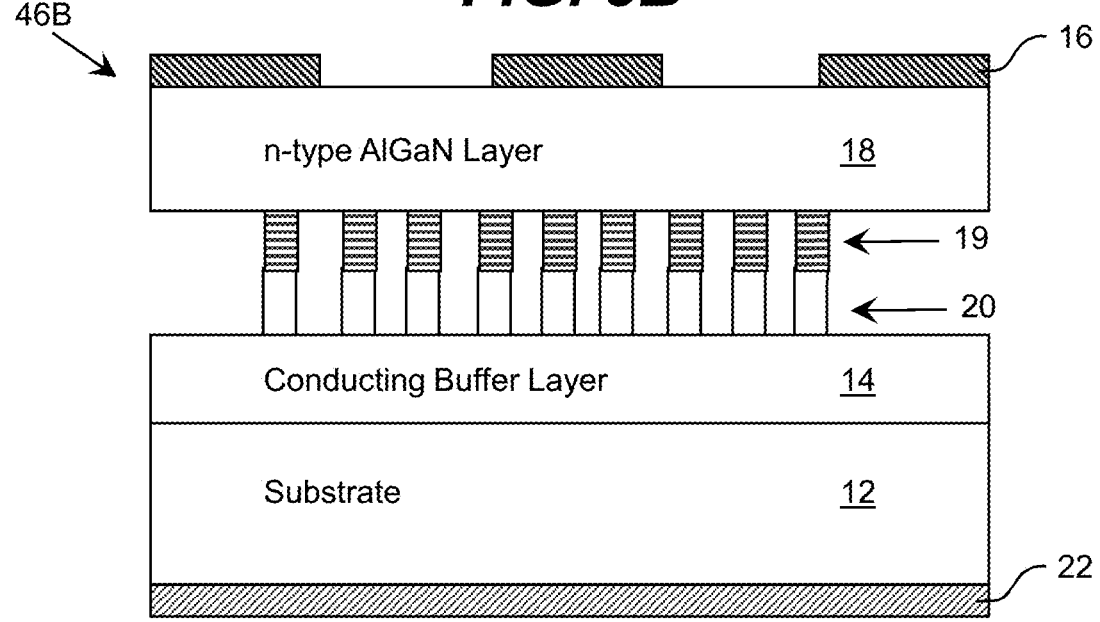

FIGS. 5A and 5B show illustrative heterostructures 46A, 46B in which the n-type semiconductor layer 18 and the active layer 19 in FIG. 5A or the p-type semiconductor layer 20 in FIG. 5B is formed using nanostructures (e.g., nanowires) according to embodiments. Growth of nanostructures can be beneficial for stress and/or light extraction characteristics. For instance, when growing on a lattice mismatched substrate 12, such as silicon with a thermal expansion coefficient that is significantly smaller than thermal expansion coefficient of group III nitride semiconductor layers, growing semiconductor nanostructures can provide a reduction of cracks and dislocations typically present in group III nitride semiconductor layers grown on such a substrate 12. An added benefit can include improved light extraction from the active layer, which can be grown as a part of the nanostructure region or a set of semiconductor layers comprising quantum wells and barriers in close proximity to the nanostructure region. While each heterostructure 46A, 46B is shown as including a nanostructure layer grown before a continuous semiconductor layer, it is understood that the order can be reversed. In this case, the nanostructure region can be beneficial for light extraction, but not as beneficial for mitigating stresses.

Figure 6A:
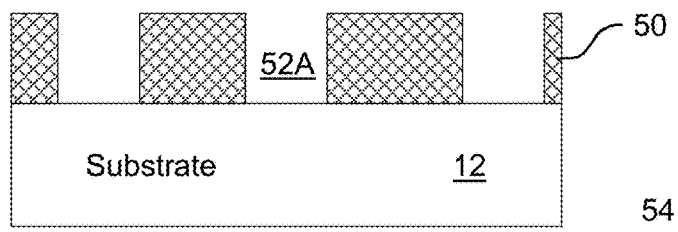
FIGS. 6A-6E show an illustrative process for fabricating a heterostructure with laterally aligned layers according to an embodiment.

In an embodiment, the n-type and p-type layers of a heterostructure can be laterally aligned on a substrate 12, rather than aligned in a growth direction. To this extent, FIGS. 6A-6E show an illustrative process for fabricating a heterostructure with laterally aligned layers according to an embodiment. In FIG. 6A, a masking layer 50 can be applied to a surface of a substrate 12 using any solution. In an embodiment, the masking layer 50 comprises a dielectric material, such as $SiO_2$, for example. As illustrated, the masking layer 50 includes a set of openings 52A that extend through the masking layer 50 to a surface of the substrate 12. While not shown, it is understood that the substrate 12 can have a buffer layer deposited prior to deposition of the masking layer 50 and/or formation of the columnar structures described herein. In an embodiment, an opening 52A corresponds to a location on which a set of n-type layers are to be grown.

Figure 6B:
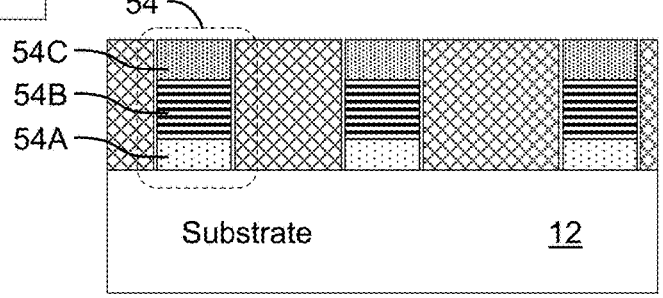

To this extent, in FIG. 6B, an n-type column 54 (e.g., a nanostructure or nanowire) is grown within each opening 52A using any solution. For example, the substrate 12 and masking layer 50 can be placed within a MOCVD chamber, where growth of the n-type column 54 is performed. In an embodiment, the n-type column 54 includes multiple n-type layers 54A-54C. For example, a first n-type layer 54A can comprise a buffer layer, such as AlN. In an embodiment, the first n-type layer 54A can comprise a dielectric layer, such as AlN or GaN. Subsequent n-type layer(s) 54B, 54C can comprise a set of group III nitride semiconductor layers, such as $Al_xGa_{1-x}N$ layers with differing molar fractions x. Each n-type layer 54B, 54C can be graded, contain a superlattice, and/or the like. Furthermore, growth of each n-type layer 54B, 54C can be configured to reduce stresses and/or dislocations present within the layer.

Figure 6C:
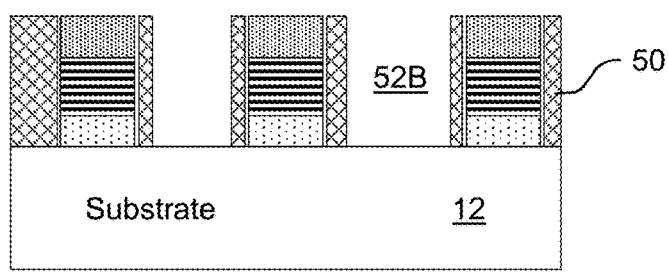

In FIG. 6C, another set of openings 52B can be created within the masking layer 50. In this case, each opening 52B can correspond to a location in which a set of p-type layers are to be grown. The openings 52B can be formed using any solution. For example, the n-type columns 54 can masked, followed by removal of the masking layer 50 to form the openings 52B. As illustrated, after formation of the openings 52B, a thin boundary of the making material can remain on each side of the openings 52B, thereby separating the n-type columns 54 from the openings 52B.

Figure 6D:
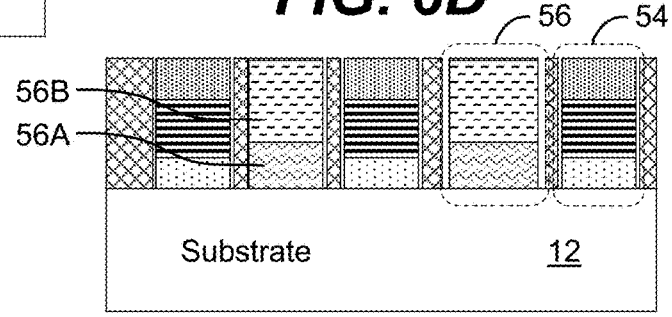

In FIG. 6D, a p-type column 56 (e.g., a nanostructure or nanowire) is grown within each opening 52B using any solution. In an embodiment, the p-type column 56 includes multiple p-type layers 56A, 56B. For example, a first p-type layer 56A can comprise a conductive buffer layer. While each column 54, 56 is described as being n-type and p-type, respectively, it is understood that the types of columns, order of growth of the columns, number of layers in the columns, etc., can be altered in various embodiments.

As illustrated in FIG. 6D, each of the respective columns 54, 56 is in close proximity to one or more columns of the opposite type, where close proximity means a fraction of the diffusion length of holes or electrons. In an embodiment, close proximity can be a few nanometers to few hundred of nanometers. In general, the few-nanometer distance is desired, and it is understood that deep UV photolithography or ion beam or e-beam lithography can be utilized.

Figure 6E:
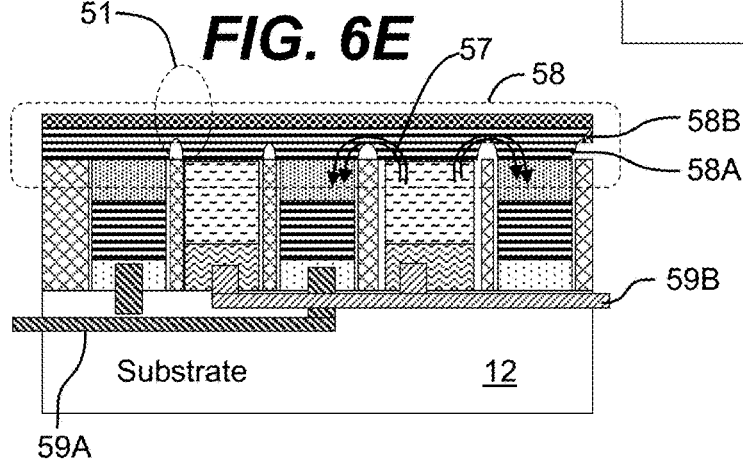

In FIG. 6E, a set of semiconductor layers 58 are formed over the top of the laterally adjacent columns 54, 56. The set of semiconductor layers 58 can include an active region 58A. The active region can include areas 51 that are formed due to layer overgrowth. In order for these regions to be small, the close proximity of n-type and p-type regions is desired. Following deposition of the layer 58A, the layer 58B is deposited, which can comprise an insulating protective transparent layer, such as $SiO_2$, $Al_2O_3$, AlN $CaF_2$, $MgF_2$, and/or the like. It is understood that since all of the emission is from the layer 58A, the layer 58B can be highly transparent. In an embodiment, layer 58B can comprise epitaxially grown AlN. In another embodiment, the layer 58B can be deposited using PVD or sputtering. In an embodiment, formation of the structure shown in FIG. 6E includes epitaxially growing the active region 58A over both a p-type column 56 and a n-type column 54, resulting in electrical connection of these two columns allowing for the current between region 54 and 56 as illustrated by current lines 57.

The design of the heterostructure shown in FIG. 6E is configured to ensure that a large percentage of light generated in the active region 58A is emitted towards a top surface of the semiconductor heterostructure. Contacts to the n-type and p-type layers can be formed using any solution. For example, the substrate 12 and/or one or more of the layers in a column 54, 56 can be etched to provide access to the layer. In an embodiment, the contacts 59A, 59B can be formed prior to deposition of the masking layer 50 shown in FIG. 6A. For example, the contacts 59A, 59B can be deposited on the substrate 12 (i.e., an insulating substrate) such that there is no electrical short between the contacts. For example, the n-type contact 59A can be deposited in the form of a first set of stripes, and/or the like, and the p-type contact 59B can be deposited in a second set of stripes, and/or the like, that do not overlap the n-type contact 59A. The corresponding stripes can be connected together on opposing sides of the structure. If necessary, a dielectric material can be deposited between the contacts 59A, 59B. For example, one or both of the contacts 59A, 59B can be deposited as a connected mesh, with dielectric material covering at least the overlapping portions of the contacts 59A, 59B.

Figure 7A:
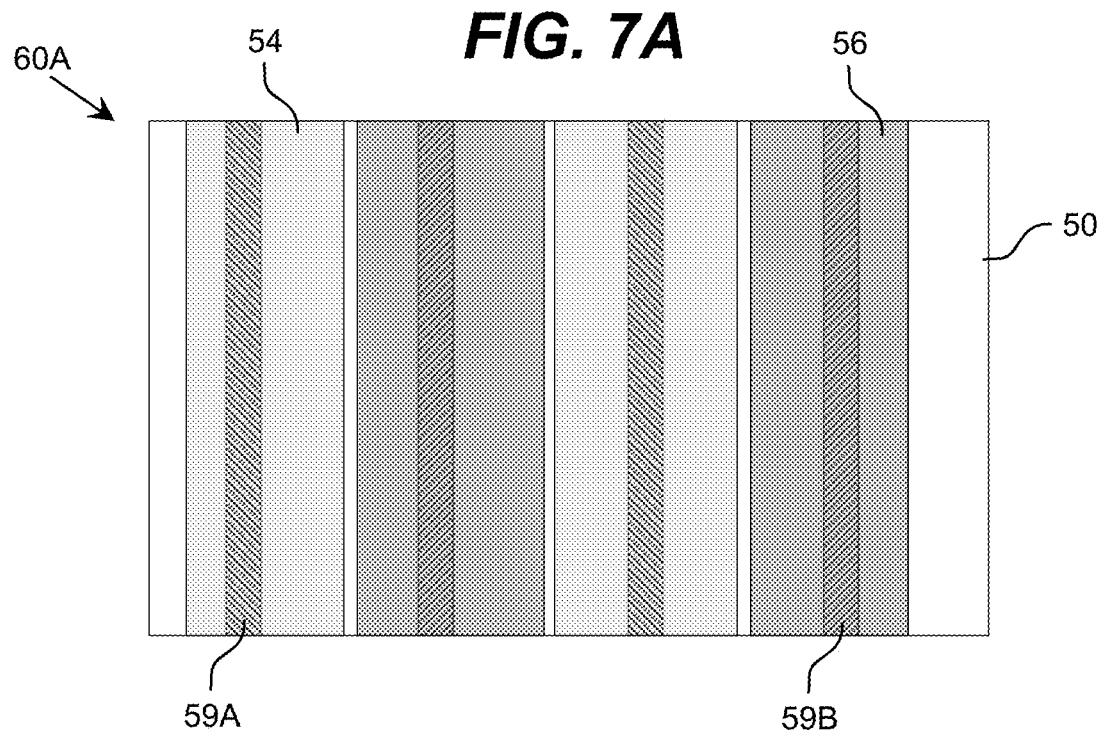
FIGS. 7A-7C illustrate alternative designs for heterostructures that can be fabricated using a process described herein according to embodiments.
Figure 7B:
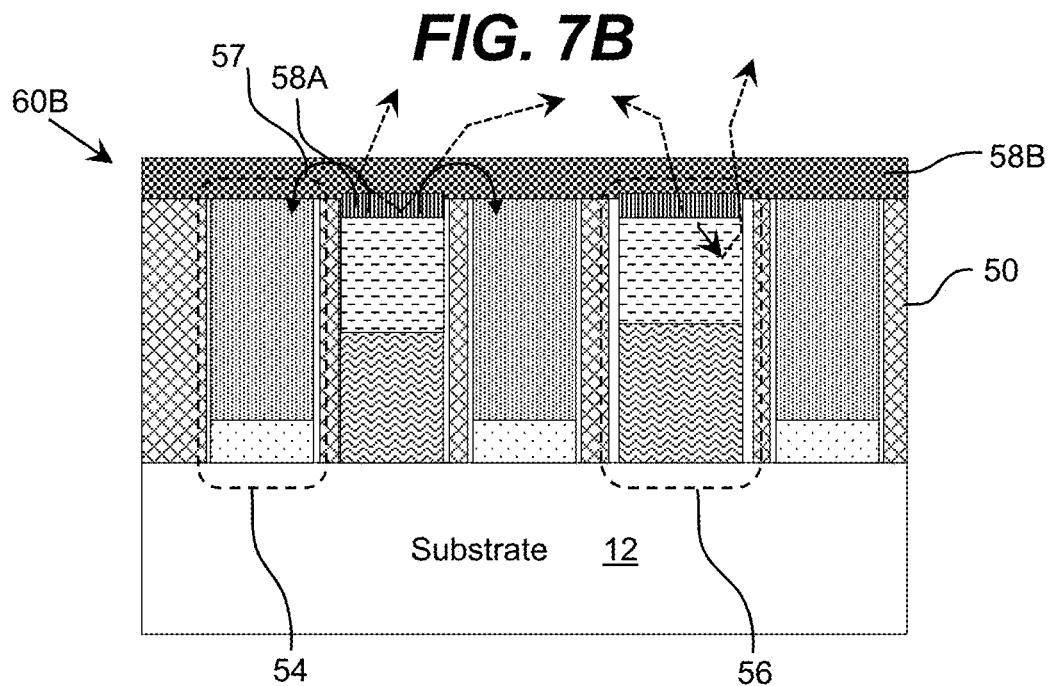
Figure 7C:
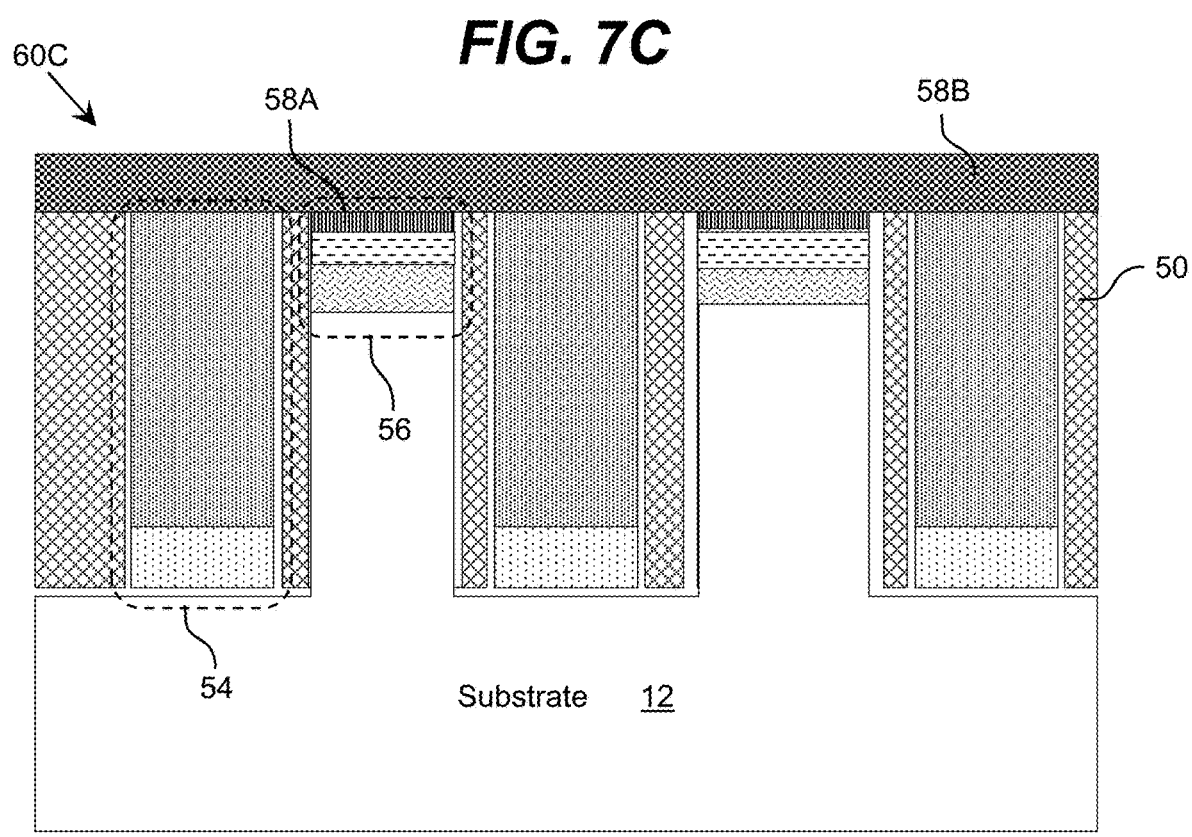

FIGS. 7A-7C illustrate alternative designs for heterostructures that can be fabricated using the process shown and described in conjunction with FIGS. 6A-6E. FIG. 7A shows a top view of an illustrative heterostructure 60A according to an embodiment. In this case, the heterostructure 60A is shown including n-type columns 54 alternating with p-type columns 56 and separated by a masking layer 50. Prior to formation of the columns 54, 56, a corresponding n-type contact layer 59A and p-type contact layer 59B can be formed on a surface of the substrate (not shown). Formation of the n-type contact layers 59A, 59B can be performed before depositing the masking layer 50 or after formation of the openings for the corresponding columns in the masking layer 50. In an embodiment, the contact layers 59A, 59B can comprise heavily doped (n-type and p-type, respectively) semiconductor material, where heavily doped implies at least $10^{19}$ 1/cm$^3$ concentration of dopants. For example, the n-type contact layer 59A can comprise an $Al_xGa_{1-x}N$ with x in the range of 0-0.5, while the p-type contact layer 59B can comprise $Al_xIn_yGa_{1-x-y}N$ with x in the range of 0-0.3 and y in the range of 0-0.1. However, it is understood that these materials are only illustrative and other materials can be utilized.

FIG. 7B shows an embodiment of a heterostructure 60B where an undoped active layer 58A is included in a p-type column 56. To connect the n-type columns 54 with the active layer 58A being part of columnar regions 54 the n-type doped semiconductor layer 58B is deposited over both columnar structures. The thickness of the n-type layer can be selected to result in overgrowth and creation of a continuous layer 58B. The deposited layer 58B allows for an electrical current to flow from layer 56 to layer 54 as shown by current lines 57. The layer 58B can be selected to be transparent to the target radiation, and can comprise n-type $Al_xGa_{1-x}N$ with an aluminum nitride molar fraction of at least 0.4.

FIG. 7C shows an illustrative heterostructure 60C in which the substrate 12 has been patterned prior to formation of the columns 54, 56. For example, the substrate 12 can comprise ridges and valleys, with the p-type columns 56 grown over the ridge portions of the patterned substrate 12, and the n-type columns 54 grown over the valley portions of the substrate 12. Such a configuration of layer growth can provide thinner p-type columns 56, which can prevent light absorption.

Figure 8A:
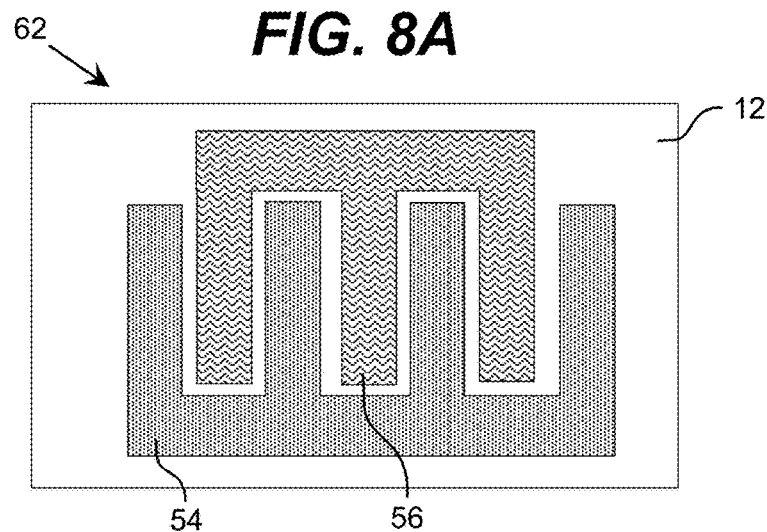
FIGS. 8A-8C show another illustrative heterostructure with an etched substrate according to an embodiment.
Figure 8B:
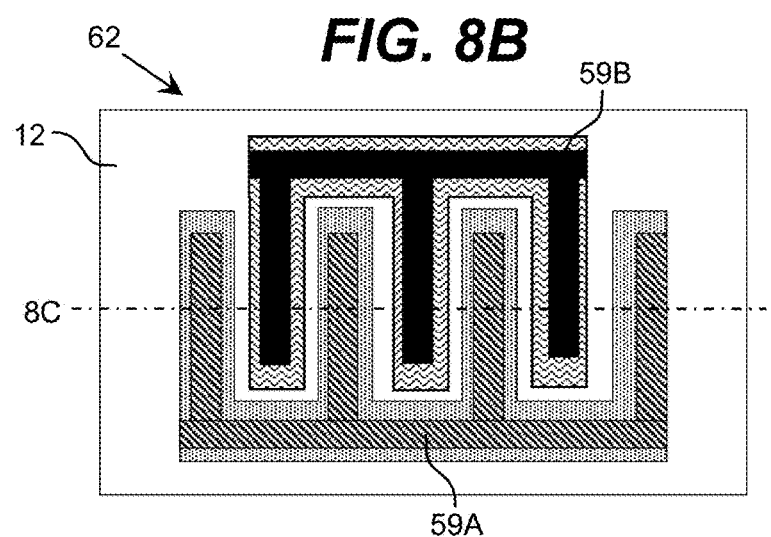
Figure 8C:
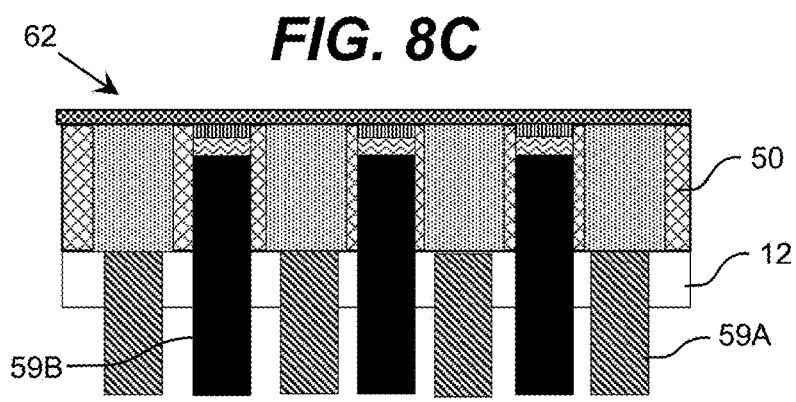

FIGS. 8A-8C show another illustrative heterostructure 62 with an etched substrate 12 according to an embodiment. In FIG. 8A, the heterostructure 62 is shown after the substrate 12 has been partially etched to access n-type regions 54 and p-type regions 56. As illustrated, the etching can form an alternating finger pattern accessing the respective regions 54, 56, with the fingers of each region 54, 56 attached on opposing sides of the surface of the substrate 12. FIGS. 8B and 8C show bottom and side views, respectively, of the heterostructure 62 with a n-type metallic contact 59A attached to the n-type region 54 and a p-type metallic contact 59B attached to the p-type region 56. Such an interdigitated arrangement of electrodes allows for reduction in current crowding.

As described herein, embodiments of a heterostructure can include nanostructures. In an embodiment, the nanostructures include the active region of the device. For example, FIGS. 9A-9D show illustrative heterostructures 64A-64D according to embodiments. Each heterostructure 64A-64D is shown including a plurality of nanostructures 66 (e.g., nanowires), each of which includes a p-type layer 56, an active region 68, and a n-type layer 54. The nanostructures 66 can be grown over a buffer layer 14, which can comprise a group III nitride material, such as an AlN layer. As illustrated, each nanostructure 66 can be physically spaced from the other nanostructures 66. It is understood that in embodiments, the polarities of the p-type layer 56 and the n-type layer 54 can be reversed.

As illustrated, during operation of the device, the active region 68 can generate radiation that is emitted out a side wall of the active region 68 and/or directed up into the n-type layer 54. In an embodiment, the active region 68 generates ultraviolet radiation, which is guided along a transparent n-type layer 54 toward a top layer 70. The top layer 70 can comprise a transparent dielectric layer, such as $SiO_2$, AlZnO, ITO, $Al_2O_3$, $CaF_2$, $MgF_2$, or Anodized Aluminum Oxide (AAO).

At least a portion of the p-type layer 56 can be embedded in an ohmic contact layer 72, which can comprise Ni, Pd and/or Rh. In an embodiment, the ohmic contact layer 72 can comprise a multilayer metallic structure with at least the metallic layer adjacent to the p-type region 56 being Ni. The metallic layer 59B can be located over the conductive layer 72 and can comprise a reflective aluminum layer, a Bragg reflective layer, an omnidirectional mirror, and/or the like. When the metallic layer 59B is a Bragg reflective layer, the sub-layers of the layer can comprise alternating layers of: $Al_2O_3$ and $HfO_2$; $Al_2O_3$ and $SiO_2$; and/or the like. The omnidirectional mirror can have a top dielectric and a bottom metallic layer. Examples of materials comprising dielectric include $SiO_2$, AlZnO, ITO, $Al_2O_3$, $CaF_2$, $MgF_2$, Anodized Aluminum Oxide (AAO), and/or the like, and the metallic layer can comprise aluminum.

Figure 9A:
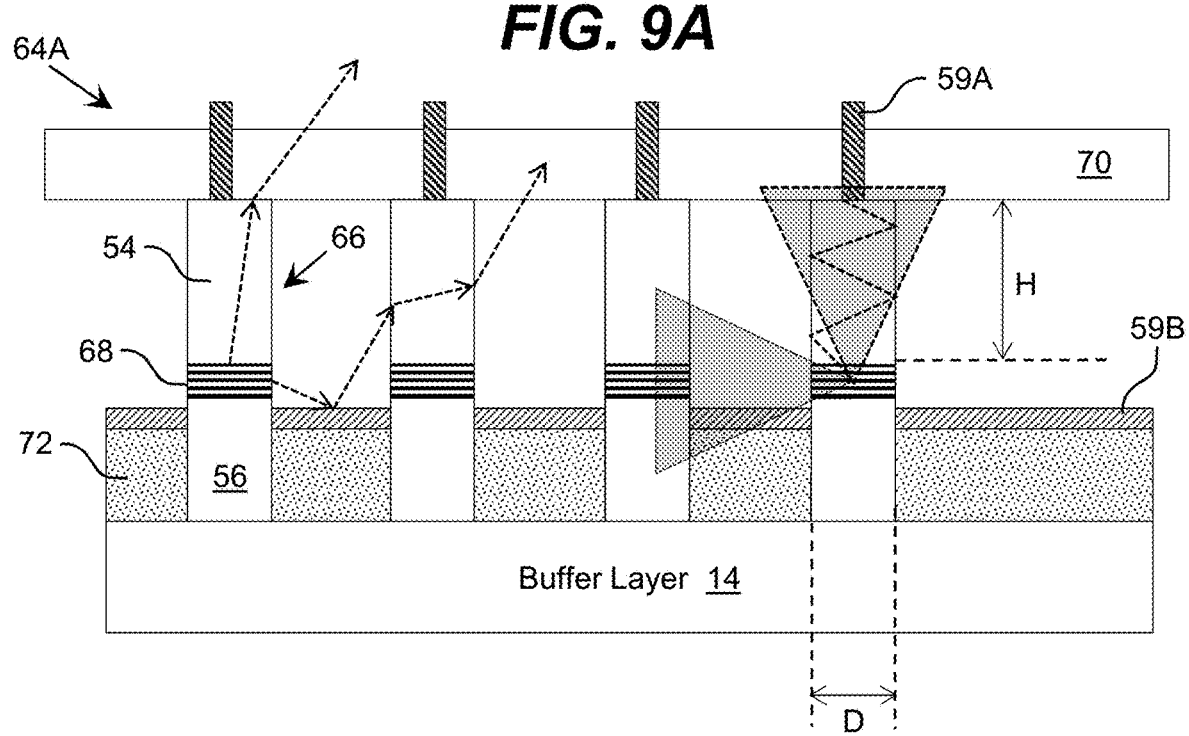
FIGS. 9A-9D show illustrative heterostructures with nanostructures according to embodiments.

In another embodiment, the layer 59B includes at least two lateral domains, where the first domain includes a conducting ohmic p-type metal located immediately adjacent to the p-type layer 56, and the second domain includes a reflective metal located in regions a current spreading distance away from the p-type layer 56 in the nanostructures 66 resulting in an improved light extraction efficiency. Regardless, the layer 59B can be below the active region 68. FIG. 9A further shows that in order to contact n-type layer 54, the n-type metallic contacts 59A can be embedded in the top layer 70 resulting in an electrical connection with the n-type layer 54.

The nanostructures 66 can have a characteristic diameter D, which can be controlled using a top-down design in which the nanostructures 66 are formed using photolithography. Alternatively, some control of the characteristic diameter D can be achieved through altering the nucleation and growth conditions during an epitaxial growth process used for grow the nanostructures 66. In an embodiment, the characteristic diameter D and a height H between the active region 68 and the top layer 70 (e.g., which can correspond to a height of the n-type layer 54) can be selected such that the top layer 70 is located within a total internal reflection (TIR) conical region.

Figure 9B:
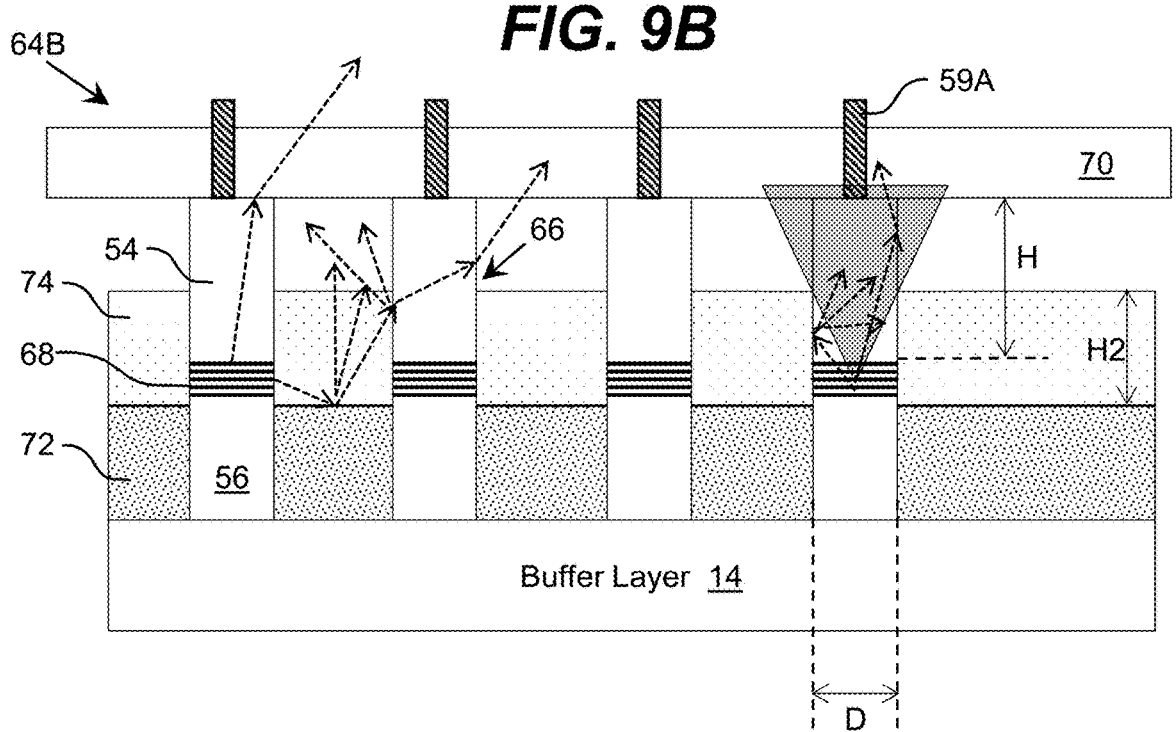

In the heterostructure 64B shown in FIG. 9B, a scattering layer 74 is located on the conductive layer 72 and can extend up the nanostructures 66 beyond the active region 68. The scattering layer 74 can be transparent to (e.g., have an absorption coefficient of at most $10^4$ 1/cm) radiation generated by the active region 68. The scattering layer 74 can improve light extraction characteristics of the heterostructure 64B by causing light exiting the sidewalls of the nanostructures 66 to be diffusively scattered. The scattering or transparent layer 74 can be formed of any suitable material including, for example, $SiO_2$, amorphous $Al_2O_3$, $SiO_2$ containing metallic particles, and/or the like. As used herein, a scattering layer is any transparent layer that further induces substantial light scattering. Furthermore, substantial light scattering is any scattering that results in at least 10% Lambertian distribution. In another embodiment, the interface between layers 72, 74 can provide a diffusively reflective scattering interface for radiation generated by the active region 68. A height H2 of the scattering layer 74 can be determined based on (e.g., selected to substantially align with) a height at of the intersection of the TIR conical region and the boundary of the nanostructure 66.

Figure 9C:
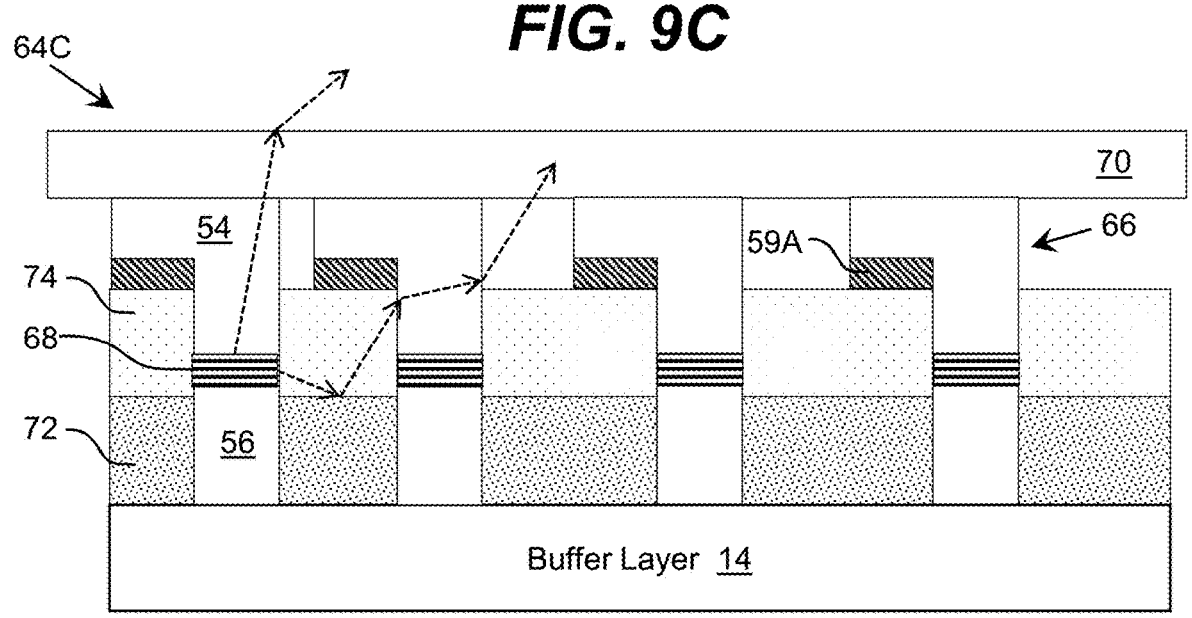
Figure 9D:
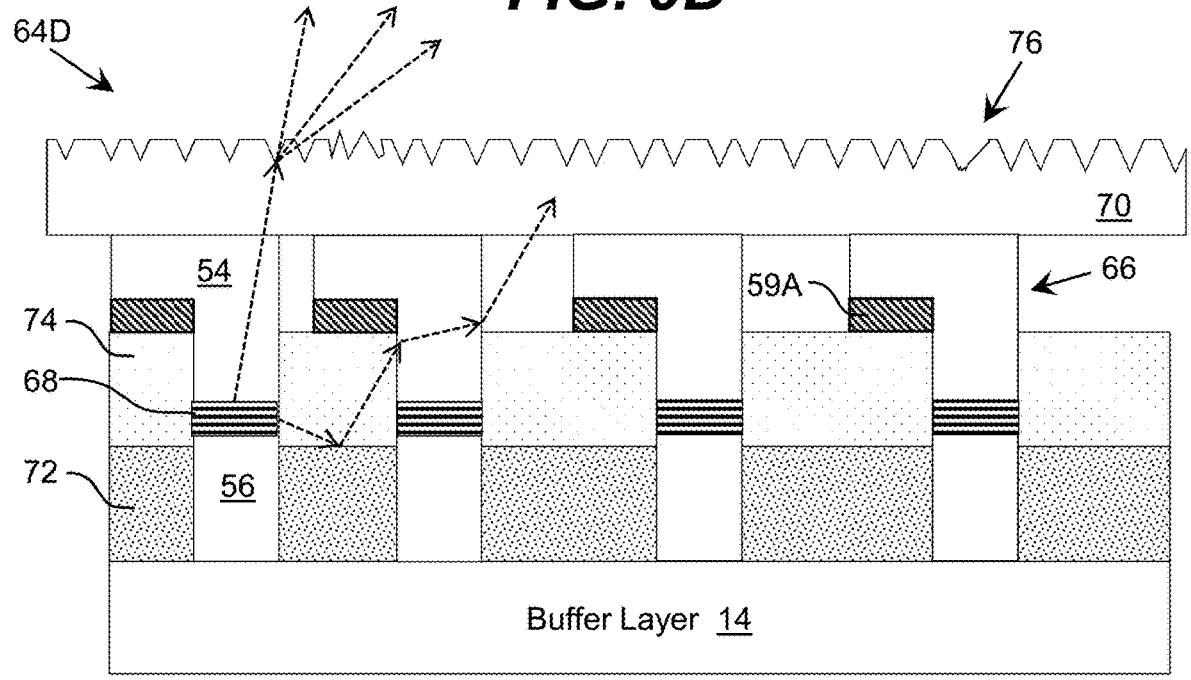

In the heterostructure 64C shown in FIG. 9C, the location of the n-type metallic contacts 59A is altered to avoid the presence of any contacts over the top surface of the top layer 70. In this case, the n-type metallic contacts 59A can be located between a surface of the scattering layer 74 and a portion of the n-type layer 54. In the heterostructure 64D shown in FIG. 9D, a top surface 76 of the top layer 70 is shown including roughness, which can be configured to provide for effective scattering of the ultraviolet radiation, which can lead to improved light extraction. The roughness of the top surface 76 can include variations in height on the surface, which are on the order of the wavelength of the radiation generated by the active region 68 or larger. In an embodiment, the surface roughness is obtained through surface etching the top surface 76.

Figure 10A:
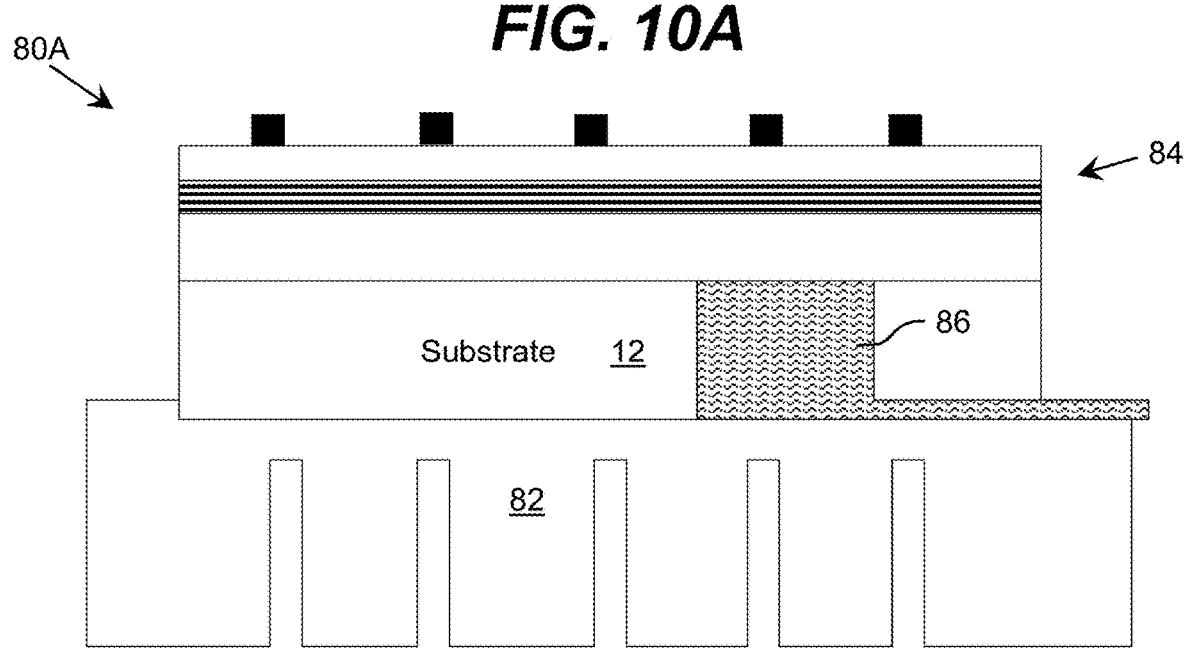
FIGS. 10A and 10B show illustrative devices with an integrated heat sink according to embodiments.
Figure 10B:
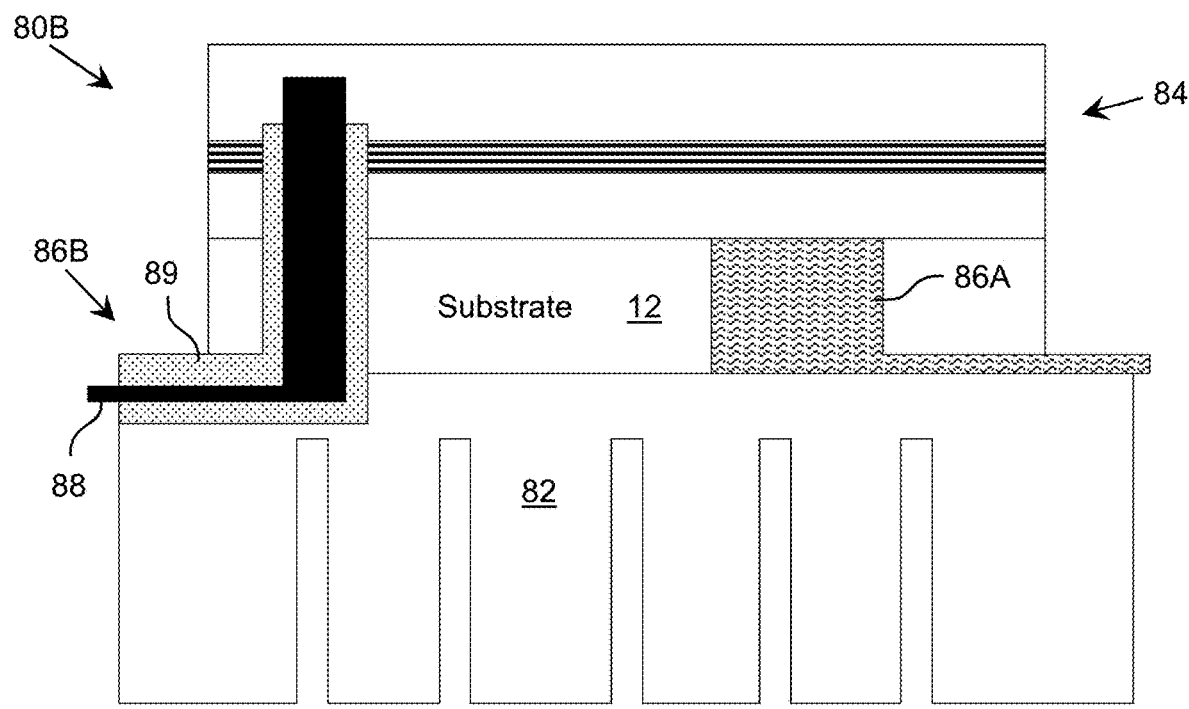

Embodiments of the heterostructures/devices described herein can include an integrated heat sink to improve thermal management during operation of the device. For example, FIGS. 10A and 10B show illustrative devices 80A, 80B with an integrated heat sink 82 according to embodiments. In FIG. 10A, the device 80A can include a thermally conductive substrate 12 with the heat sink 82 attached to one side thereof. The device 80A further includes a heterostructure 84 described herein located on the opposing side of the substrate 12. An integrated heat sink 86 extends through the substrate 12 to directly contact both the heterostructure 84 and the heat sink 82.

In an embodiment, the integrated heat sink is fabricated as shown and described in U.S. Provisional Application No. 62/240,585, which was filed on 13 Oct. 2015, and which is hereby incorporated by reference. In this case, the integrated heat sink 86 can directly contact both the heat sink 82 as well as only one of either the n-type layer or p-type layer in the heterostructure 84 or a metallic contact thereof. In an embodiment, the integrated heat sink 86 contacts the p-type layer. In an embodiment, the integrated heat sink 86 can be formed by making via-holes in the substrate 12 and filling the via-holes with a metal material, such as copper, gold, a material with high thermal conductivity, such as AlN, and/or the like. In another embodiment, the integrated heat sink 86 can be formed by fabricating a heat sink 82 with the integrated heat sink 86 and depositing an insulating material to form the substrate 12. In another embodiment, the integrated heat sink 86 can be soldered to the heat sink 82 prior to depositing the insulating material for the substrate 12.

In FIG. 10B, the device 80B is shown including two integrated heat sinks 86A, 86B. Each integrated heat sink 86A, 86B can directly contact a different one of: the n-type layer in the heterostructure or a metallic contact thereof; or the p-type layer in the heterostructure or a metallic contact thereof. Each integrated heat sink 86A, 86B can include a metal or other material with high thermal conductivity, which directly contacts the respective n-type or p-type structure. As shown in conjunction with the integrated heat sink 86B, an integrated heat sink can include a metal 88, which is isolated from one or more portions of the device 80B (e.g., p-type layer, active layer, and/or the like) by an insulating layer 89. In an embodiment, one or both integrated heat sinks 86A, 86B can function both as an electrical connection to the corresponding structure and as a thermal heat conducting structure.

It is understood that the heterostructures and devices described herein can include any combination of various additional features. For example, a heterostructure described herein can include one or more additional structures designed for increasing an amount of light extracted from the device. In an embodiment, a heterostructure described herein includes one or more Bragg reflective layers (e.g., distributed Bragg reflector or DBR layers). To this extent, FIG. 11A shows an illustrative heterostructure 90 including a Bragg reflective layer 92 according to an embodiment, while FIGS. 11B and 11C show details of illustrative Bragg reflector layers 92A, 92B according to embodiments.

Figure 11A:
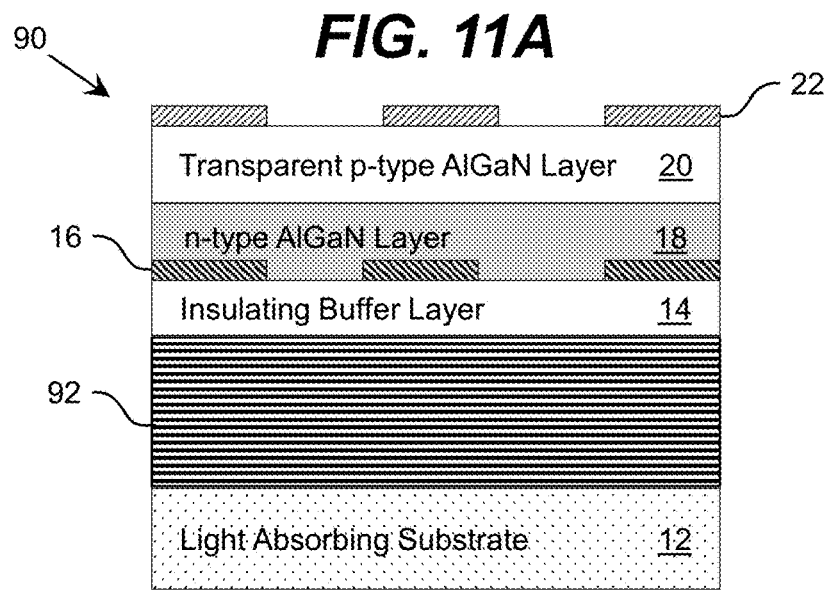
FIG. 11A shows an illustrative heterostructure including a Bragg reflective layer according to an embodiment.
Figure 11B:
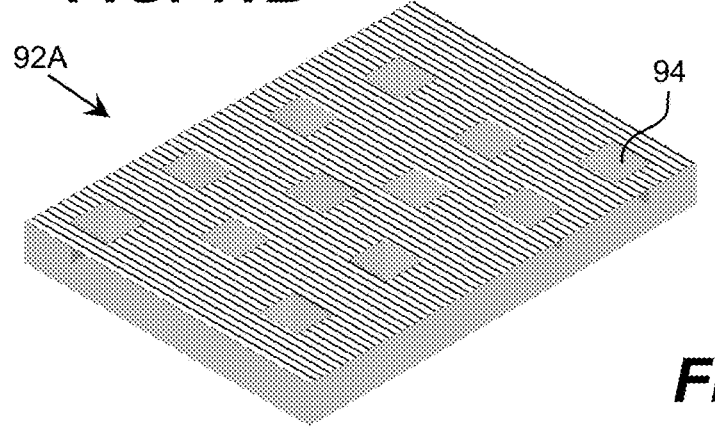
FIGS. 11B and 11C show details of illustrative Bragg reflector layers according to embodiments.
Figure 11C:
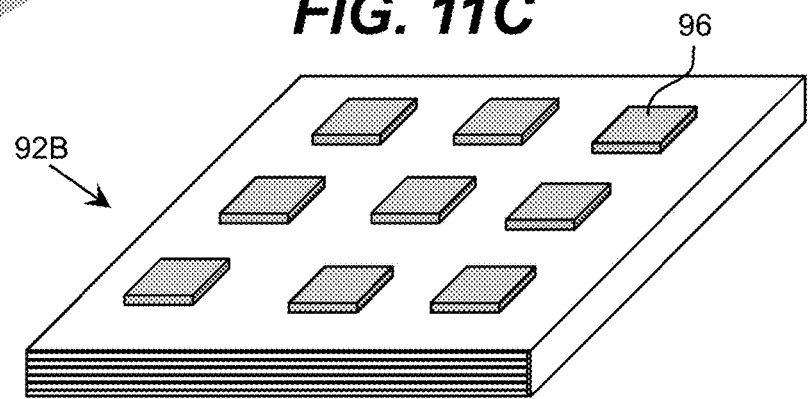

As illustrated in FIG. 11A, the Bragg reflective layer 92 can be located between a light absorbing substrate 12 and an insulating buffer layer 14 in the heterostructure 90. It is understood that the Bragg reflective layer 92 includes sub-layers formed of alternating materials transparent to target radiation (e.g., radiation generated by an active region in the heterostructure) with an overall transparency of at least fifty percent through the thickness of the sub-layer. In an embodiment, the thickness of each sub-layer is approximately a quarter wavelength of the target radiation measured within the material forming the sub-layer. For ultraviolet radiation, the sub-layers forming the Bragg reflective layer 92 can comprise $SiO_2$, $CaF_2$, $MgF_2$, AAO, $Al_2O_3$, Hafnium, and/or the like.

The Bragg reflective layer 92 can include one or more features to improve epitaxial growth of semiconductor layers thereon. For example, as shown in FIG. 11B, a Bragg reflective layer 92A can be patterned to result in vacancies 94 which can extend through the thickness of the Bragg reflective layer. The vacancies 94 can be used for improving a quality of subsequent semiconductor layers grown thereon. As shown in FIG. 11C, the Bragg reflective layer 92B can include Bragg reflective elements 96 formed within the vacancies 94 (FIG. 11B). For example, the Bragg reflective elements 96 can comprise Bragg reflective superlattices tailored to reflect radiation having the target wavelength.

A Bragg reflective layer can be incorporated into a device heterostructure using any solution. For example, as described herein, a Bragg reflective layer can be epitaxially grown in the device heterostructure. Alternatively, a Bragg reflective layer can be bonded to one or more layers of a device heterostructure. For example, FIG. 12 shows formation of an illustrative device heterostructure 100 according to an embodiment. In this case, a heterostructure 102 can be fabricated using any solution. For example, the heterostructure 102 can be fabricated on a substrate which is subsequently removed from the heterostructure using a liftoff procedure, or the like. Additionally, a Bragg reflective layer 92 (shown including vacancies) can be fabricated on a substrate 12, which can be a light absorbing substrate such as silicon, or the like. The Bragg reflective layer 92 can be attached 1046 to the heterostructure 102 using any solution, such as wafer bonding (e.g., using metal solder), and/or the like, to form the device heterostructure 100.

It is understood that the location of the Bragg reflective layer 92 in the device heterostructure 100 is only illustrative, and a heterostructure described herein can include one or more Bragg reflective layers in any combination of various locations. For example, FIGS. 13A and 13B show illustrative heterostructures 106A, 106B with Bragg reflective layers according to embodiments. As shown in FIG. 13A, a heterostructure 106A can include a Bragg reflective layer 92 located between a buffer layer 14 and the remainder of the device heterostructure 108, which can include for example one or more n-type layers, an active region, one or more p-type layers, contacts, and/or the like. In an embodiment, one or more Bragg reflective layers can be included within the device heterostructure. For example, In FIG. 13B, a heterostructure 106B is shown including two Bragg reflective layers 92A, 92B located on opposing sides of an active region 58. Each Bragg reflective layer 92A, 92B can further comprise a n-type or p-type cladding layer. The inclusion of Bragg reflective layers 92A, 92B located on both sides of an active region 58 can be useful for light confinement, for example, when the heterostructure 106B forms a laser (e.g., an optically pumped laser or a laser diode), a photodiode, and/or the like.

A Bragg reflective layer described herein can include elements configured to provide any of various functions. Furthermore, when a heterostructure includes multiple Bragg reflective layers the elements of the Bragg reflective layers can be configured to work together to provide any of various functions. For example, FIGS. 14A-14C show illustrative heterostructures 110A-110C including multiple Bragg reflective layers 92A, 92B according to embodiments. In each heterostructure 110A-110C, the Bragg reflective layers 92A, 92B are located on opposing sides of an active region 58. Furthermore, each Bragg reflective layer 92A, 92B is shown including elements 112A, 112B, respectively, each of which is formed of a different material than the surrounding Bragg reflective layer 92A, 92B. The elements 112A, 112B in the respective Bragg reflective layers 92A, 92B can have any relation with respect to each other. For example, in the heterostructure 110A, the elements 112A, 112B are substantially aligned with each other; in the heterostructure 110B, the elements 112A, 112B are phase shifted with respect to each other; and in the heterostructure 110B, the elements 112A, 112B have different arrangements, which can be unrelated to each other.

The arrangement of and materials forming the elements 112A, 112B can be selected to provide any desired function. For example, the elements 112A, 112B can be arranged to form a photonic crystal in the lateral direction. The materials of the elements 112A, 112B can form a Bragg reflector in the vertical direction. It is understood that the elements 112A, 112B can be formed from dissimilar semiconductor materials. For example, each group of elements 112A, 112B can be formed of group III nitride materials with distinct aluminum nitride molar fractions.

Figure 15:
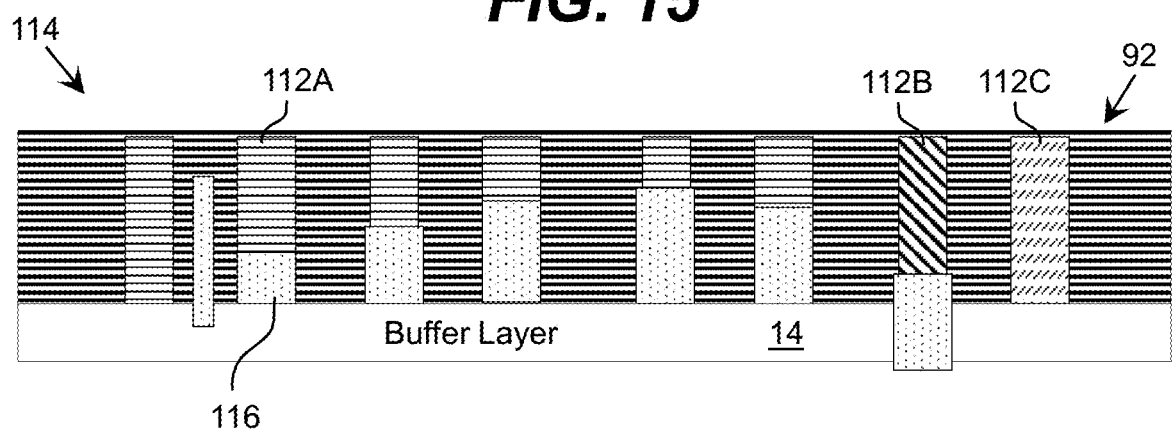
FIG. 15 shows an illustrative heterostructure including a Bragg reflective layer according to an embodiment.

It is understood that the elements of a Bragg reflective layer described herein can have any combination of various attributes, which can also can vary between elements in the same Bragg reflective layer. For example, FIG. 15 shows an illustrative heterostructure 114 including a Bragg reflective layer 92 according to an embodiment. As illustrated, the Bragg reflective layer 92 includes various vacancies, which can extend only partially through the Bragg reflective layer 92, all the way through the Bragg reflective layer 92, and/or partially or entirely through an underlying semiconductor layer, such as a buffer layer 14. The vacancies can be filled with elements, which can include multiple different configurations. For example, some elements are shown including only a Bragg reflective element 112A, while other elements are shown a least partially filled with a light scattering material 116. Element 112B can comprise a reflective structure (e.g., a DBR structure), which allows some leakage of the radiation, while element 112C can comprise a reflective structure (e.g., a DBR structure), which allows a high amount of light transmission. It is understood that the particular combination of elements shown in heterostructure 114 is only illustrative and various modifications are possible, including modifications in which only some of the elements shown are present and/or alternatively configured elements are present. In an embodiment, the Bragg reflective layer 92 is formed of layers of a dielectric material, while the elements are formed of semiconductor materials.

While certain features may be shown and described in conjunction with only one or some of the heterostructure and/or device configurations included herein, it is understood that a heterostructure described herein can include any combination of the various features described herein. To this extent, the various drawings do not show mutually exclusive features which cannot be combined to form heterostructures or devices not explicitly shown in the drawings.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 16:
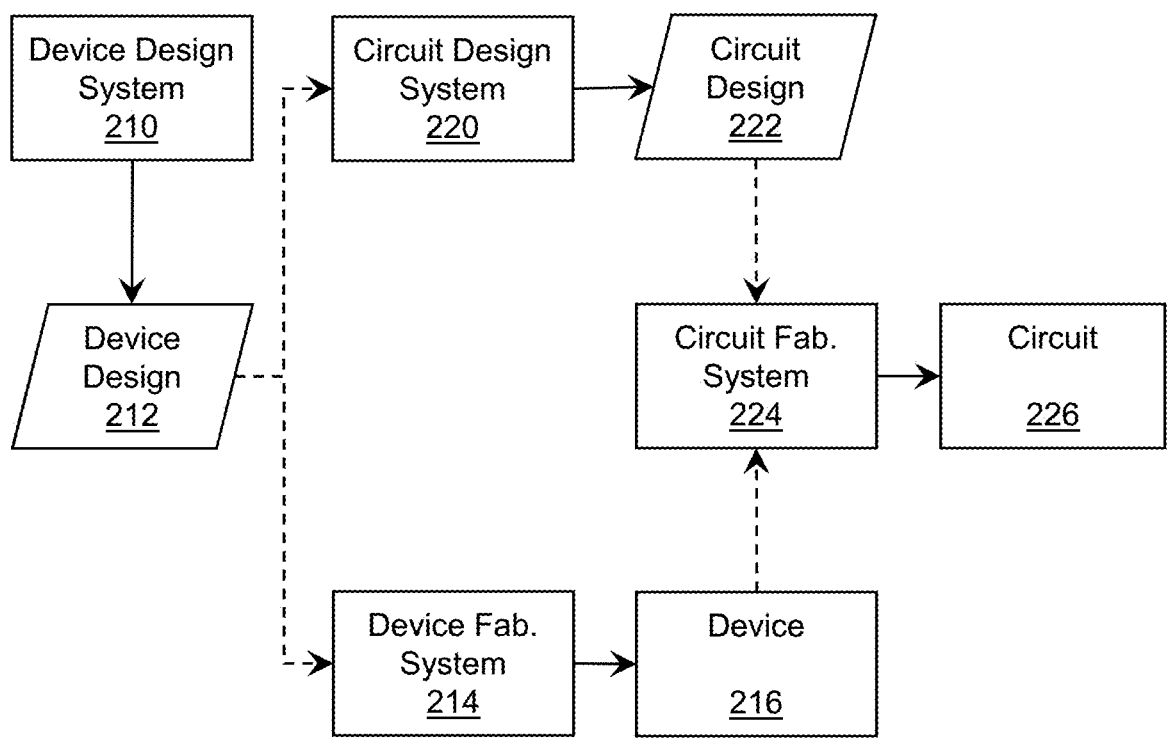
FIG. 16 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 16 shows an illustrative flow diagram for fabricating a circuit 226 according to an embodiment. Initially, a user can utilize a device design system 210 to generate a device design 212 for a semiconductor device as described herein. The device design 212 can comprise program code, which can be used by a device fabrication system 214 to generate a set of physical devices 216 according to the features defined by the device design 212. Similarly, the device design 212 can be provided to a circuit design system 220 (e.g., as an available component for use in circuits), which a user can utilize to generate a circuit design 222 (e.g., by connecting one or more inputs and outputs to various devices included in a circuit). The circuit design 222 can comprise program code that includes a device designed as described herein. In any event, the circuit design 222 and/or one or more physical devices 216 can be provided to a circuit fabrication system 224, which can generate a physical circuit 226 according to the circuit design 222. The physical circuit 226 can include one or more devices 216 designed as described herein.

In another embodiment, the invention provides a device design system 210 for designing and/or a device fabrication system 214 for fabricating a semiconductor device 216 as described herein. In this case, the system 210, 214 can comprise a general purpose computing device, which is programmed to implement a method of designing and/or fabricating the semiconductor device 216 as described herein. Similarly, an embodiment of the invention provides a circuit design system 220 for designing and/or a circuit fabrication system 224 for fabricating a circuit 226 that includes at least one device 216 designed and/or fabricated as described herein. In this case, the system 220, 224 can comprise a general purpose computing device, which is programmed to implement a method of designing and/or fabricating the circuit 226 including at least one semiconductor device 216 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 210 to generate the device design 212 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 210 for designing and/or a device fabrication system 214 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An optoelectronic device comprising:
   a substrate formed of a light absorbing material;
   a plurality of physically spaced nanostructures formed on the substrate, wherein the plurality of nanostructures include:
      a group III nitride semiconductor layer of a first polarity located on the substrate; and
      an active region located on the group III nitride semiconductor layer; and
      a group III nitride semiconductor layer of a second polarity, different from the first polarity, located adjacent to the active region;
   a first contact directly contacting the group III nitride semiconductor layer of the first polarity;
   a transparent dielectric layer covering the plurality of nanostructures, wherein the transparent dielectric layer covers a top surface of each of the plurality of nanostructures, and wherein the transparent dielectric layer includes a plurality of openings formed there through, each opening vertically coincident with a portion of the top surface of one of the nanostructures; and
   a second contact directly contacting the group III nitride semiconductor layer of the second polarity, wherein the second contact includes a plurality of second contact segments, each second contact segment formed in one of the openings in the transparent dielectric layer, wherein the each second contact segment includes a first portion that contacts the top surface of a corresponding nanostructure and an opposing second portion that extends out from a corresponding opening in the transparent dielectric layer past an exterior surface of the transparent dielectric layer.

2. The device of claim 1, wherein the first contact includes a plurality of openings extending entirely there through, wherein the plurality of openings of the first contact and the second contact form a periodic optical structure, wherein the periodic optical structure of both the first and second contacts form a photonic crystal that controls propagation of light.

3. The device of claim 1, wherein the plurality of nanostructures further includes the group III nitride semiconductor layer of the second polarity, the device further comprising a layer of ultraviolet reflective material located in the lateral area between each of the nanostructures, wherein the layer of ultraviolet reflective material has a height less than a height of the group III nitride semiconductor layer of the first polarity.

4. An optoelectronic device comprising:
   a substrate formed of a light absorbing material;
   a plurality of physically spaced nanostructures formed on the substrate, wherein the plurality of nanostructures include:

a group III nitride semiconductor layer of a first polarity located on the substrate;
an active region located on the group III nitride semiconductor layer; and
a group III nitride semiconductor layer of a second polarity, different from the first polarity, located adjacent to the active region;
a first contact directly contacting the group III nitride semiconductor layer of the first polarity, wherein a portion of the group Ill nitride semiconductor layer of a first polarity is embedded in the first contact;
a transparent dielectric layer covering the plurality of nanostructures, wherein the transparent dielectric layer covers a top surface of each of the plurality of nanostructures, and wherein the transparent dielectric layer includes a plurality of openings formed there through; and
a second contact directly contacting the group III nitride semiconductor layer of the second polarity, wherein the second contact includes a plurality of second contact segments, each second contact segment formed in one of the openings in the transparent dielectric layer, wherein the each second contact segment includes a first portion that contacts the top surface of a corresponding nanostructure and an opposing second portion that extends out from a corresponding opening in the transparent dielectric layer past an exterior surface of the transparent dielectric layer.

5. The device of claim 4, wherein each of the plurality of openings formed in the transparent dielectric layer opening is vertically coincident with a portion of the top surface of one of the nanostructures.

6. The device of claim 4, further comprising a scattering layer located on the first contact and contacting the active region, wherein the scattering layer induces substantial light scattering of light emitted from the active region.

7. The device of claim 6, wherein the scattering layer extends above and below the active region.

8. The device of claim 6, wherein a portion of the group III nitride semiconductor layer of a second polarity is embedded in the scattering layer.

9. The device of claim 6, wherein the scattering layer comprises a transparent dielectric material.

10. The device of claim 4, wherein the first contact is separated from the transparent dielectric layer by a predetermined spacing.

11. The device of claim 4, wherein the first contact comprises a multilayer metallic structure.

12. The device of claim 4, further comprising a metallic layer formed on the first contact, wherein the metallic layer is located below the active region, wherein the metallic layer is selected from the group comprising a reflective aluminum layer, a Bragg reflective layer and an omnidirectional mirror.

* * * * *

UNITED STATES PATENT AND TRADEMARK OFFICE
CERTIFICATE OF CORRECTION

PATENT NO. : 10,790,410 B2
APPLICATION NO. : 15/331895
DATED : September 29, 2020
INVENTOR(S) : Michael Shur, Grigory Simin and Alexander Dobrinsky It is certified that error appears in the above-identified patent and that said Letters Patent is hereby corrected as shown below:

In the Specification

At Column 9, Line 67, "$Al_xGa_{1-x}N/AlGa_{1-y}N$" should read "$Al_xGa_{1-x}N/Al_yGa_{1-v}N$".

In the Claims

In Claim 1, at Column 20, Line 21, "group Ill" should read "group III".

In Claim 4, at Column 21, Line 10, "group Ill" should read "group III".

Signed and Sealed this
Tenth Day of November, 2020

Andrei Iancu
*Director of the United States Patent and Trademark Office*